United States Patent
Tsunemine

(10) Patent No.: US 10,096,554 B2
(45) Date of Patent: Oct. 9, 2018

(54) SEMICONDUCTOR DEVICE HAVING AN EPITAXIAL LAYER AND MANUFACTURING METHOD THEREOF

(71) Applicant: Renesas Electronics Corporation, Tokyo (JP)

(72) Inventor: Yoshikazu Tsunemine, Ibaraki (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/582,919

(22) Filed: May 1, 2017

(65) Prior Publication Data

US 2017/0358539 A1 Dec. 14, 2017

(30) Foreign Application Priority Data

Jun. 9, 2016 (JP) ................................. 2016-115296

(51) Int. Cl.
| | | |
|---|---|---|
| *H01L 21/311* | (2006.01) | |
| *H01L 23/544* | (2006.01) | |
| *H01L 21/027* | (2006.01) | |
| *H01L 29/06* | (2006.01) | |

(52) U.S. Cl.
CPC ........ *H01L 23/544* (2013.01); *H01L 21/0273* (2013.01); *H01L 21/31111* (2013.01); *H01L 29/0649* (2013.01)

(58) Field of Classification Search
CPC ........... H01L 21/0273; H01L 21/31111; H01L 23/544; H01L 29/0649; H01L 2021/60075; H01L 21/67282; H01L 2223/544; H01L 27/14625; H01L 31/0232; H01L 31/18
USPC ................................. 257/797; 438/401, 462
See application file for complete search history.

(56) References Cited

U.S. PATENT DOCUMENTS

| | | | | |
|---|---|---|---|---|
| 6,395,617 | B2 * | 5/2002 | Ando .................... | H01L 23/544 257/797 |
| 6,878,506 | B2 * | 4/2005 | Tsubata .............. | G03F 7/70633 257/E23.179 |
| 7,615,493 | B2 * | 11/2009 | Kim ...................... | H01L 23/544 257/E21.548 |
| 2013/0214337 | A1 * | 8/2013 | Kashihara ........... | H01L 27/1464 257/294 |
| 2017/0179037 | A1 * | 6/2017 | Lee ........................ | H01L 21/78 |
| 2017/0221833 | A1 * | 8/2017 | Lu ......................... | H01L 23/544 |

FOREIGN PATENT DOCUMENTS

JP 4794377 B2 10/2011

* cited by examiner

*Primary Examiner* — Shahed Ahmed
(74) *Attorney, Agent, or Firm* — Sughrue Mion, PLLC

(57) ABSTRACT

A mark is formed over the surface of a silicon substrate. The mark includes a silicon oxide film, in which a plurality of rectangular groove patterns are concentrically arranged, and a silicon nitride film formed in the groove patterns. A P-type epitaxial layer is formed over the surface of the silicon substrate. Then, a photoresist pattern is formed. In the photoresist pattern, a rectangular opening pattern is formed in a mark region. Optical superposition inspection is performed for the base of the photoresist pattern.

7 Claims, 35 Drawing Sheets

SEMICONDUCTOR DEVICE HAVING AN EPITAXIAL LAYER AND MANUFACTURING METHOD THEREOF

CROSS-REFERENCE TO RELATED APPLICATIONS

The disclosure of Japanese Patent Application No. 2016-115296 filed on Jun. 9, 2016 including the specification, drawings and abstract is incorporated herein by reference in its entirety.

The present invention relates to a semiconductor device and a manufacturing method therefor, and is preferably applicable to a semiconductor device including, for example, an epitaxial layer and a mark for superposition inspection.

BACKGROUND

In a semiconductor device including a high withstand voltage semiconductor element, a plurality of pn junction structures are formed in a semiconductor substrate including a silicon substrate. When a pnp junction structures are formed, an n-type region is formed by injecting n-type impurities into the surface of a p-type silicon substrate. Then, a p-type region (an epitaxial layer) is formed using an epitaxial growth method, on the surface of its n-type region.

An element region is defined on the p-type region. In the element region, a high withstand voltage semiconductor element, such as an n-channel type high withstand voltage MOS transistor, is formed. The element region is defined by forming an element isolation region in a predetermined region in the p-type region which has been formed using the epitaxial growth method.

To form the element isolation region in the p-type region, a mark for superposition inspection is formed in advance, on the surface of the silicon substrate. By detecting this mark and a photoresist pattern, it is determined whether a desired photoresist pattern for forming the element isolation region has been formed in a predetermined position relative to the base pattern.

This mark is applied to a determination as to whether a desired photoresist pattern has been formed, at the time when, for example, a drain region of a high withstand voltage element is formed in the p-type region. This type of semiconductor device is disclosed in Japanese Unexamined Patent Application Publication No. 2008-16639.

SUMMARY

In epitaxial growth at the time of forming the p-type region, silicon having the same lattice constant as the crystal of the silicon substrate is grown from the surface of the silicon substrate, thereby forming an epitaxial layer (a p-type region).

There is provided a silicon substrate whose surface is inclined relative to a predetermined crystal orientation, to suppress roughness (haze) of the surface. That is, there is a silicon substrate having an off angle. In this silicon substrate, the epitaxial layer is grown obliquely in accordance with the off angle.

At this time, in the mark region, silicon is obliquely grown in accordance with the off angle from the surface part of the exposed silicon substrate, relative to the pattern of the mark having a predetermined thickness. Thus, in the mark region, it may undesirably cause breakdown of symmetry of surface morphology of the mark and the silicon.

If the symmetry of the surface morphology breaks down, inspection accuracy is decreased, at the time of optically inspecting whether a desired photoresist pattern has been formed, relative to the base pattern. Other objects and new features will be apparent from the descriptions of the present specification and the accompanying drawings.

According to one embodiment, there is provided a semiconductor device having a crystal substrate, a mark, a crystal layer, and an interlayer insulating film. The mark is formed in a first region in the crystal substrate. The crystal layer is formed over the crystal substrate in a state excluding a region where the mark is arranged. The interlayer insulating film is formed to cover the mark and the crystal layer. The mark includes a first insulating film which has a groove pattern, and a second insulating film which is formed in the groove pattern and has a material different from that of the first insulating film.

According to another embodiment, there is provided a method of manufacturing a semiconductor device, including the following steps. A mark is formed in a first region in a crystal substrate. A crystal layer is formed over a surface of an exposed crystal substrate, using an epitaxial growth method. One photoresist pattern is formed, by applying one photoresist to cover the crystal layer and the mark and performing a photoengraving process. The crystal layer is processed, using the one photoresist pattern as a mask. The step of forming the mark includes the steps. A first insulating film is formed over a surface of the crystal substrate. Another photoresist pattern is formed, by applying another photoresist to cover the first insulating film and performing a photoengraving process. A first pattern having a groove pattern is formed, by etching the first insulating film, using the another photoresist pattern as an etching mask. A second insulating film having a material different from that of the first insulating film is formed, to cover the first pattern. A second pattern is formed, by performing anisotropic etching for an entire surface of the second insulating film to remove the second insulating film while remaining a part of the second insulating film which is positioned in the groove pattern.

According to the semiconductor device of the one embodiment, it is possible to improve inspection accuracy for optically inspecting whether a desired photoresist pattern has been formed relative to the base pattern.

According to the manufacturing method of the semiconductor device according to another embodiment, it is possible to improve inspection accuracy for optically inspecting whether a desired photoresist pattern is formed relative to the base pattern.

DETAILED DESCRIPTION

Embodiment 1

Figure 1:
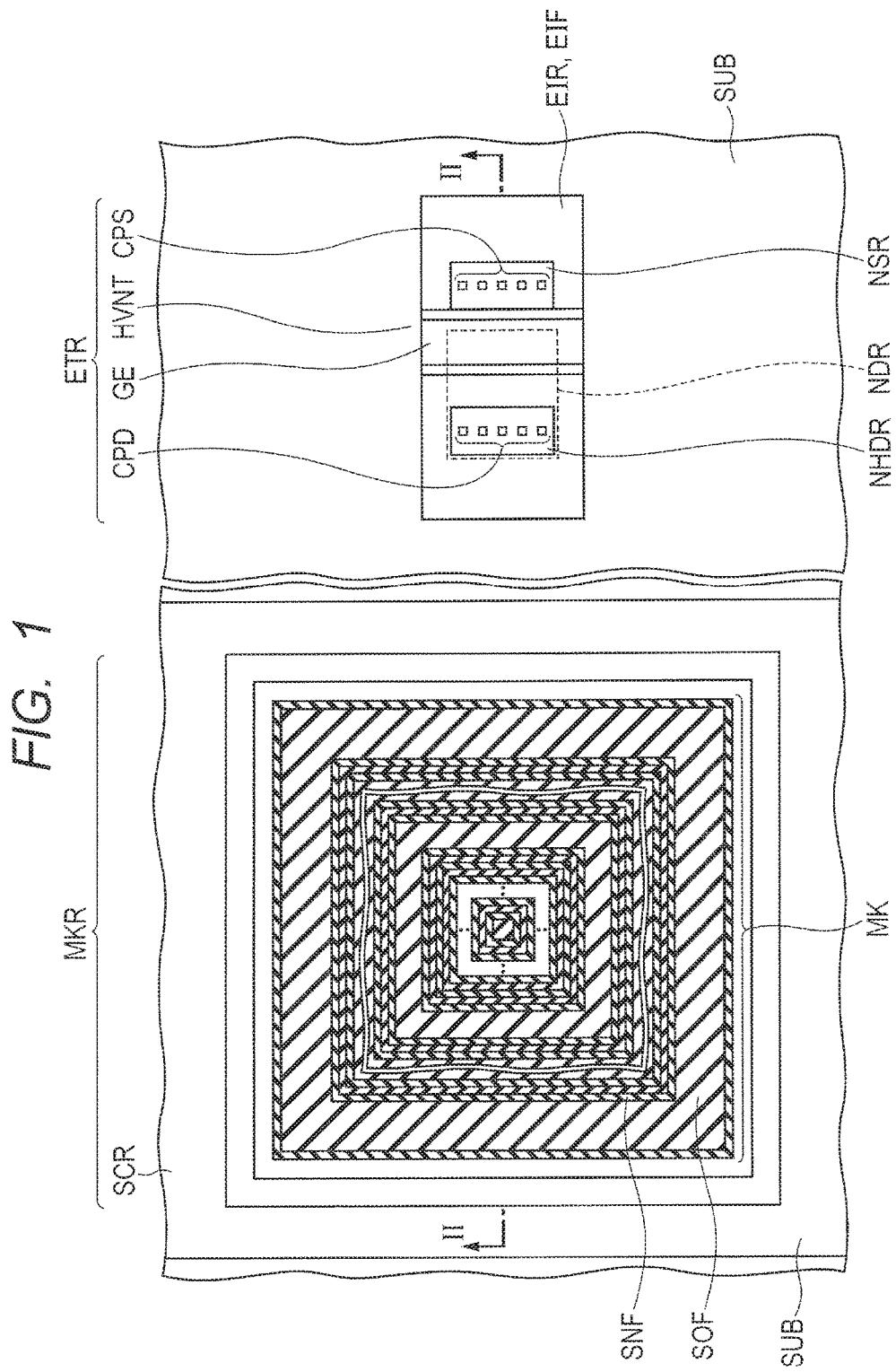
FIG. 1 is a plan view showing a semiconductor device according to an embodiment 1.
Figure 2:
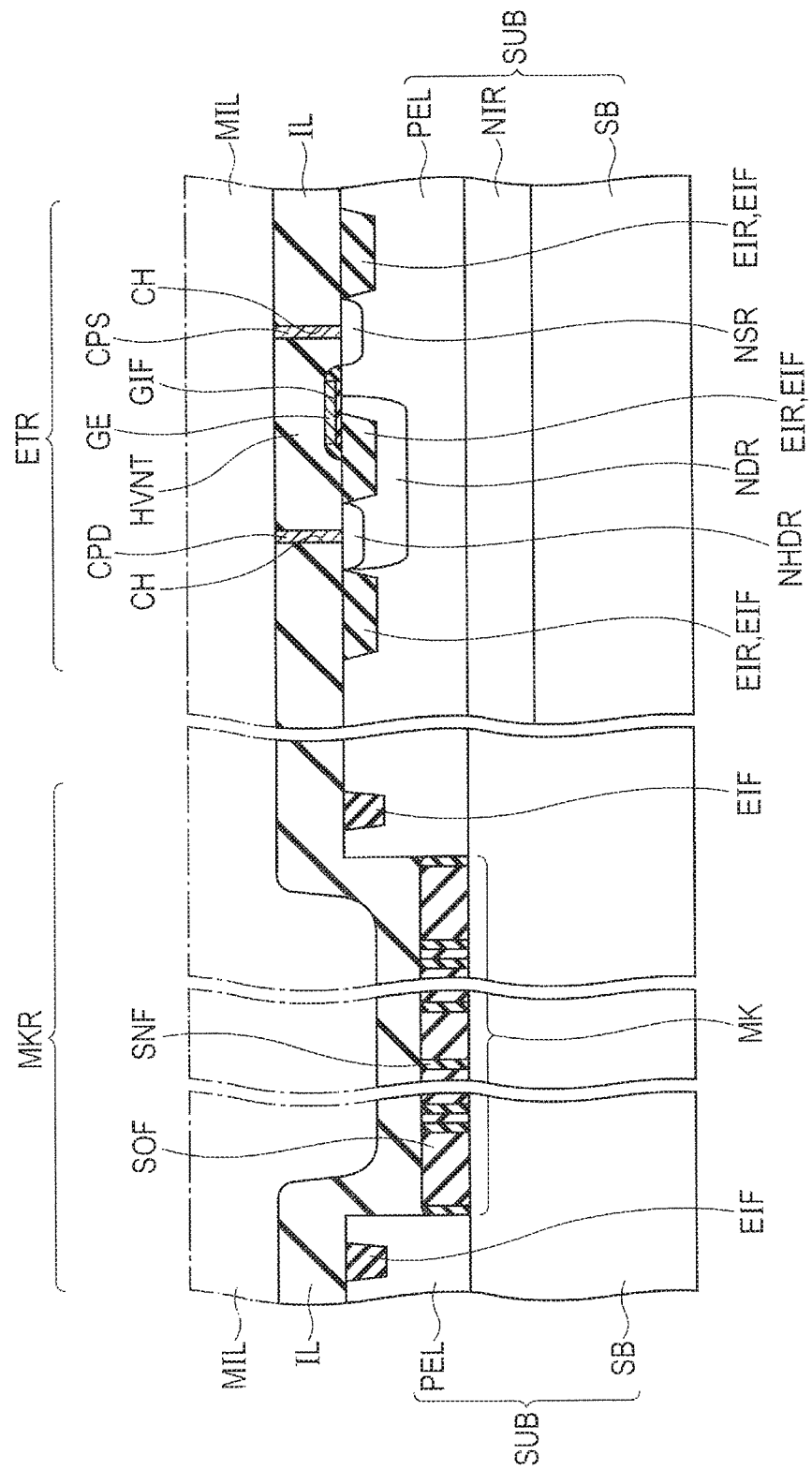
FIG. 2 is a cross sectional view taken along a line II-II illustrated in FIG. 1, in the same embodiment.

Descriptions will now be made to a semiconductor device according to an embodiment 1. As illustrated in FIG. 1 and FIG. 2, on a semiconductor substrate SUB, an element region ETR and a mark region MKR are defined. The semiconductor substrate SUB includes a silicon substrate SB (a crystal substrate) and a p-type epitaxial layer PEL (a crystal layer). The p-type epitaxial layer PEL is formed over a surface of the silicon substrate SB, using an epitaxial growth method. In the element region ETR, an N-type injection region NIR is formed over a predetermined depth from the surface of the silicon substrate SB in advance, for forming a pn junction.

An element isolation region EIR is formed in the p-type epitaxial layer PEL positioned in the element region ETR. In the element isolation region EIR, an element isolation film is formed in a trench. In the element region ETR, for example, a high withstand voltage NMOS transistor HVNT is formed, as a high withstand voltage semiconductor element. A high withstand voltage NMOS transistor HVNT includes an N-type impurity region NDR and a high concentration N-type impurity region NHDR as drains, an N-type impurity region NSR as a source, and a gate electrode GE.

The N-type impurity region NDR and the high concentration N-type impurity region NHDR are formed in a predetermined region of the p-type epitaxial layer PEL defined by the element isolation region EIR. The N-type impurity region NSR is formed in another predetermined region of the p-type epitaxial layer PEL defined by the element isolation region EIR. The gate electrode GE is formed through a gate insulating film GIF, over a part of the p-type epitaxial layer PEL which is sandwiched between its N-type impurity region NDR and the N-type impurity region NSR.

In the mark region MKR, a mark MK is formed over the surface of the silicon substrate SB. The mark MK is used at the time of optically determining whether a photoresist pattern formed through a photoengraving process has been formed in a desired position relative to the base pattern. This will specifically be described later.

The mark MK is formed from two kinds of insulating films having different materials. In the case, this is formed from a silicon oxide film SOF and a silicon nitride film SNF, as one example. A groove pattern is concentrically formed in the rectangular silicon oxide film SOF. The silicon nitride film SNF is formed in the groove pattern. In the mark region MKR, the p-type epitaxial layer PEL is formed in a state excluding the region where the mark MK is arranged.

An interlayer insulating film IL is formed to cover the high withstand voltage NMOS transistor HUNT, the mark MK, and the p-type epitaxial layer PEL. Contact plugs CPD and CPS are formed in contact holes CH penetrating through the interlayer insulating film IL. The contact plug CPD is electrically coupled to the high concentration N-type impurity region NHDR, while the contact plug CPS is electrically coupled to the N-type impurity region NSR.

A multilayer wiring structure MIL is formed to cover the interlayer insulating film IL. The multiplayer wiring structure MIL has a plurality of wiring layers including wirings (not illustrated) which are electrically coupled to the contact plugs CPD and CPS. In this semiconductor device, for example, the mark region MKR is arranged in a scribing region SCR. However, the mark region MKR may be arranged in the element region ETR. The semiconductor device according to the embodiment 1 is configured as described above.

Figure 3:
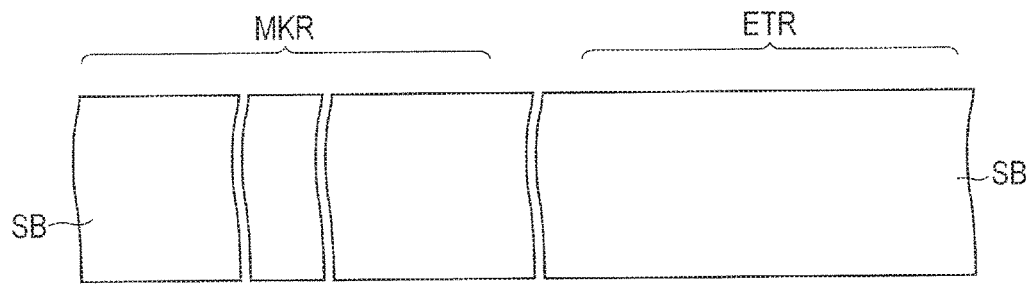
FIG. 3 is a cross sectional view showing one process of a manufacturing method of the semiconductor device, in the same embodiment.
Figure 4:
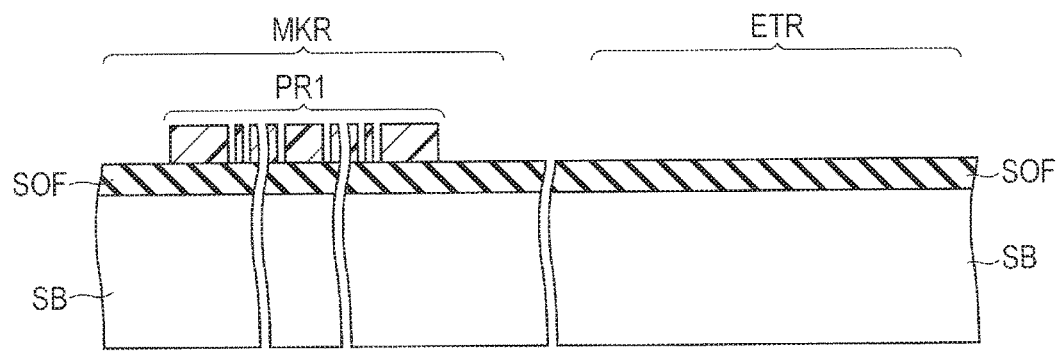
FIG. 4 is a cross sectional view showing a process performed after the process illustrated in FIG. 3, in the same embodiment.

Descriptions will now be made to an example of a manufacturing method of the above-described semiconductor device. As illustrated in FIG. 3, first, a silicon substrate SB is prepared. As illustrated in FIG. 4, a silicon oxide film SOF is formed on the surface of the silicon substrate SB, using a CVD (Chemical Vapor Deposition) method. The silicon oxide film SOF has a thickness of approximately, for example, 400 nm. The silicon oxide film SOF may be formed by performing, for example, thermal oxidation for the silicon substrate SB, other than the CVD method.

Figure 5:
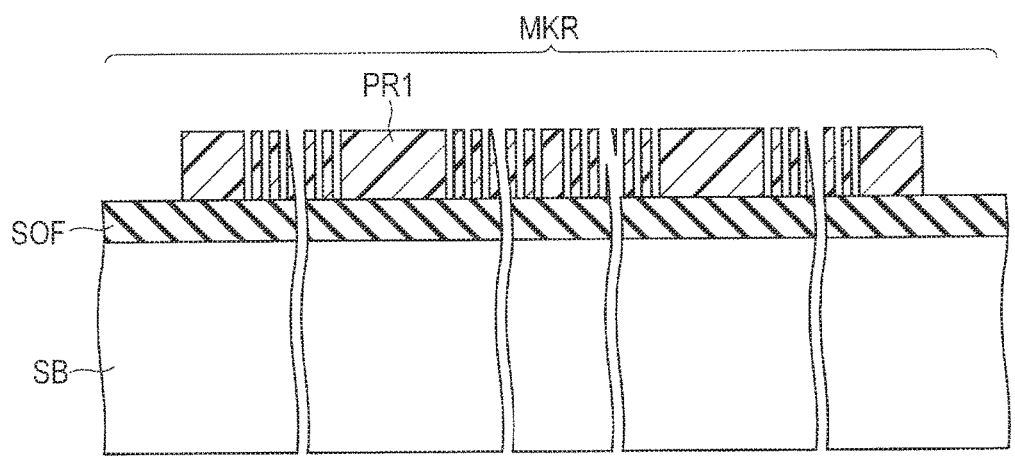
FIG. 5 is a partially enlarged cross sectional view showing a mark region in the process illustrated in FIG. 4, in the same embodiment.

A photoresist (not illustrated) is applied to cover the silicon oxide film SOF. A predetermined photoengraving process is performed, thereby forming a photoresist pattern PR1 in the mark region MKR. FIG. 5 is a cross sectional view showing the enlarged mark region MKR. A plurality of rectangular groove patterns are concentrically formed in the photoresist pattern PR1.

Figure 6:
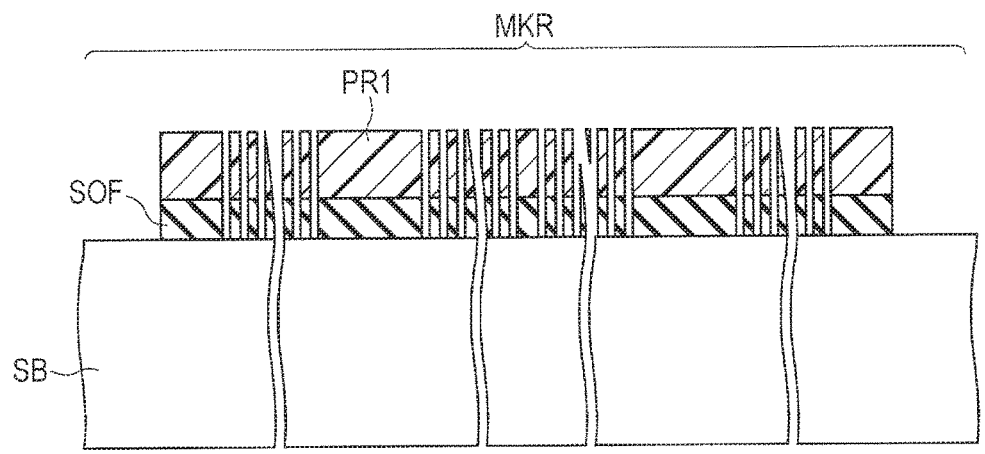
FIG. 6 is a partially enlarged cross sectional view showing a process performed after the process illustrated in FIG. 4 and FIG. 5, in the same embodiment.
Figure 7:
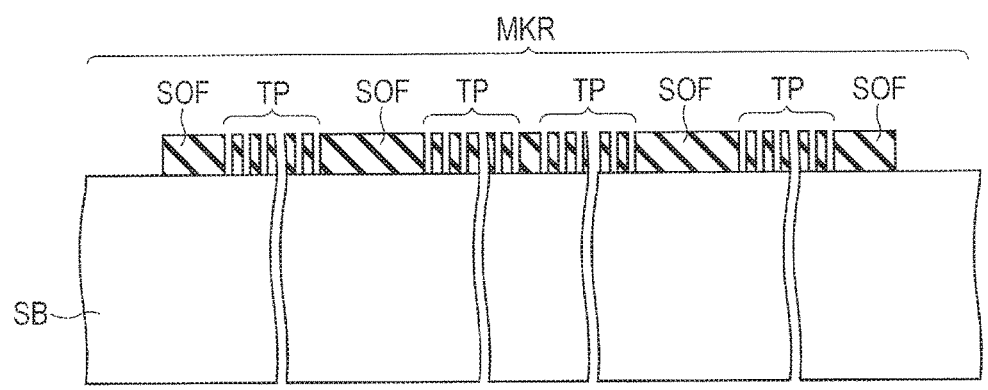
FIG. 7 is a partially enlarged cross sectional view showing a process performed after the process illustrated in FIG. 6, in the same embodiment.

As illustrated in FIG. 6, an etching process is performed for the silicon oxide film SOF, using the photoresist pattern PR1 as an etching mask. As illustrated in FIG. 7, the photoresist pattern PR1 is removed, thereby exposing the patterned silicon oxide film SOF. On the silicon oxide film SOF, a plurality of rectangular groove patterns TP corresponding to the photoresist pattern PR1 are concentrically formed. The width of each groove pattern TP is, for example, approximately 200 nm.

Figure 8:
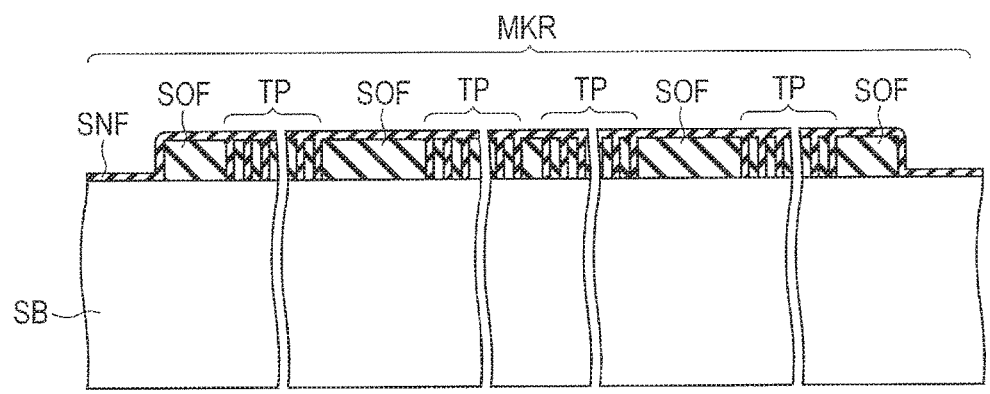
FIG. 8 is a partially enlarged cross sectional view showing a process performed after the process illustrated in FIG. 7, in the same embodiment.

There is now formed an insulating film having materials different from those of the silicon oxide film SOF. As illustrated in FIG. 8, a silicon nitride film SNF is formed using, for example, a CVD method, to cover the silicon oxide film SOF. At this time, the silicon nitride film SNF is formed also in the groove patterns TP, to fill the groove patterns TP. The thickness of the silicon nitride film SNF is approximately, for example, 120 nm. An anisotropic etching process (whole surface etch back process) is carried out for the entire surface of the silicon nitride film SNF.

Figure 9:
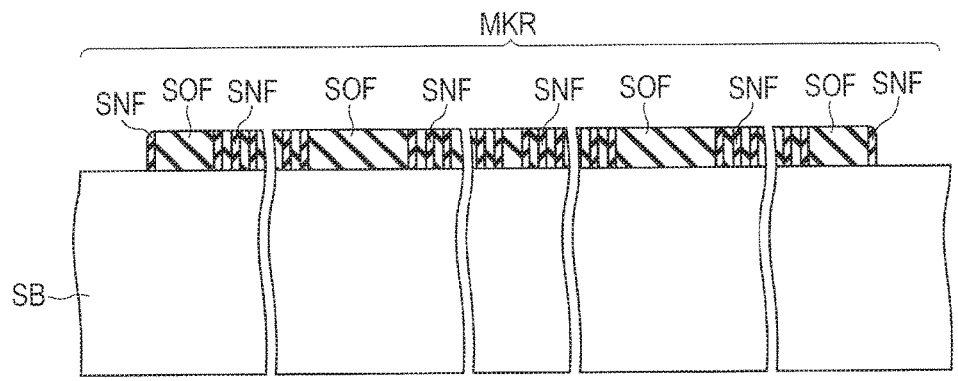
FIG. 9 is a partially enlarged cross sectional view showing a process performed after the process illustrated in FIG. 8, in the same embodiment.
Figure 10:
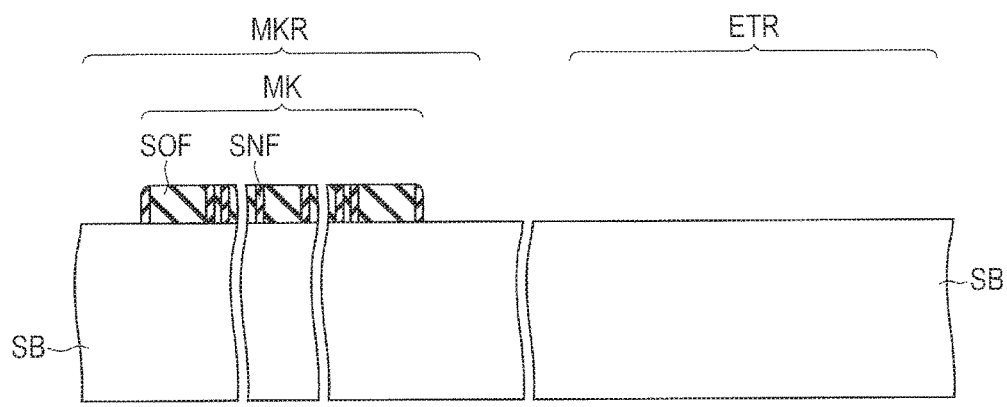
FIG. 10 is a cross sectional view showing a mark region and an element region in the process illustrated in FIG. 9, in the same embodiment.

In this manner, as illustrated in FIG. 9, of the silicon nitride film SNF, the parts positioned over the upper surface of the silicon oxide film SOF and positioned over the surface of the silicon substrate SB are removed, while remaining those parts positioned in the groove patterns TP and positioned on the side wall of the silicon oxide film SOF. As illustrated in FIG. 10, a mark MK formed of the silicon oxide film SOF and the silicon nitride film SNF is formed in the mark region MKR.

Figure 11:
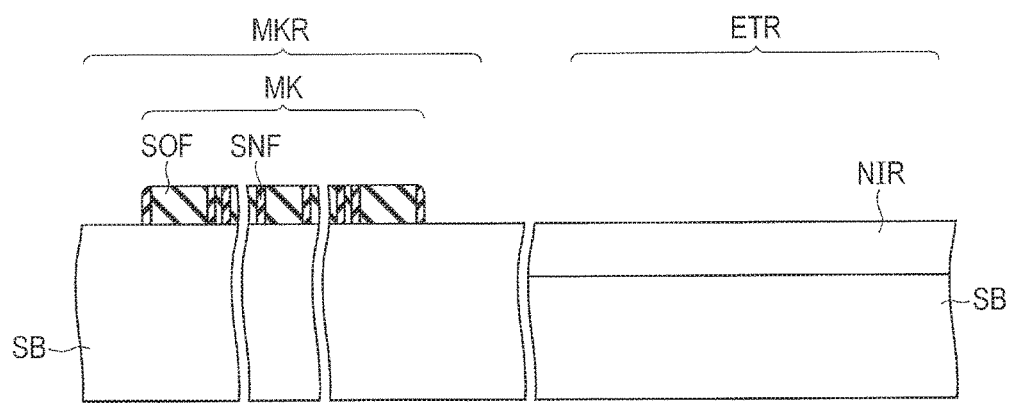
FIG. 11 is a cross sectional view showing a process performed after a process illustrated in FIG. 10, in the same embodiment.
Figure 12:
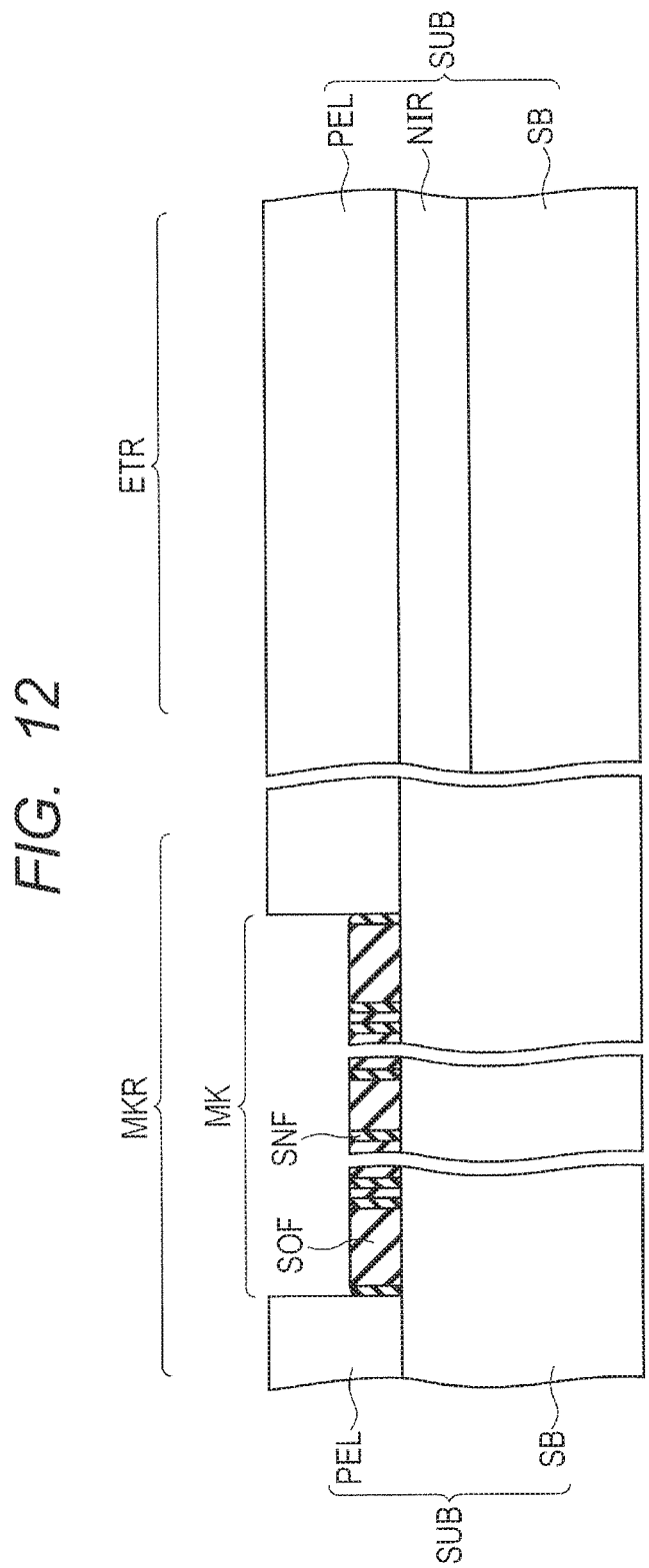
FIG. 12 is a cross sectional view showing a process performed after the process illustrated in FIG. 11, in the same embodiment.

As illustrated in FIG. 11, the N-type injection region NIR is formed by injecting N-type impurities into the element region ETR. As illustrated in FIG. 12, the P-type epitaxial layer PEL is formed on the surface of the exposed silicon substrate SB, including the surface of the N-type injection region NIR, using the epitaxial growth method. The thickness of the P-type epitaxial is approximately, for example, a few μm to 6 μm.

At this time, in a region where the mark MK is arranged in the mark region MKR, the surface of the silicon substrate SB is covered by the silicon oxide film SOF and the silicon nitride film SNF. Thus, the P-type epitaxial layer PEL is not grown in the region where the mark MK is arranged.

Figure 13:
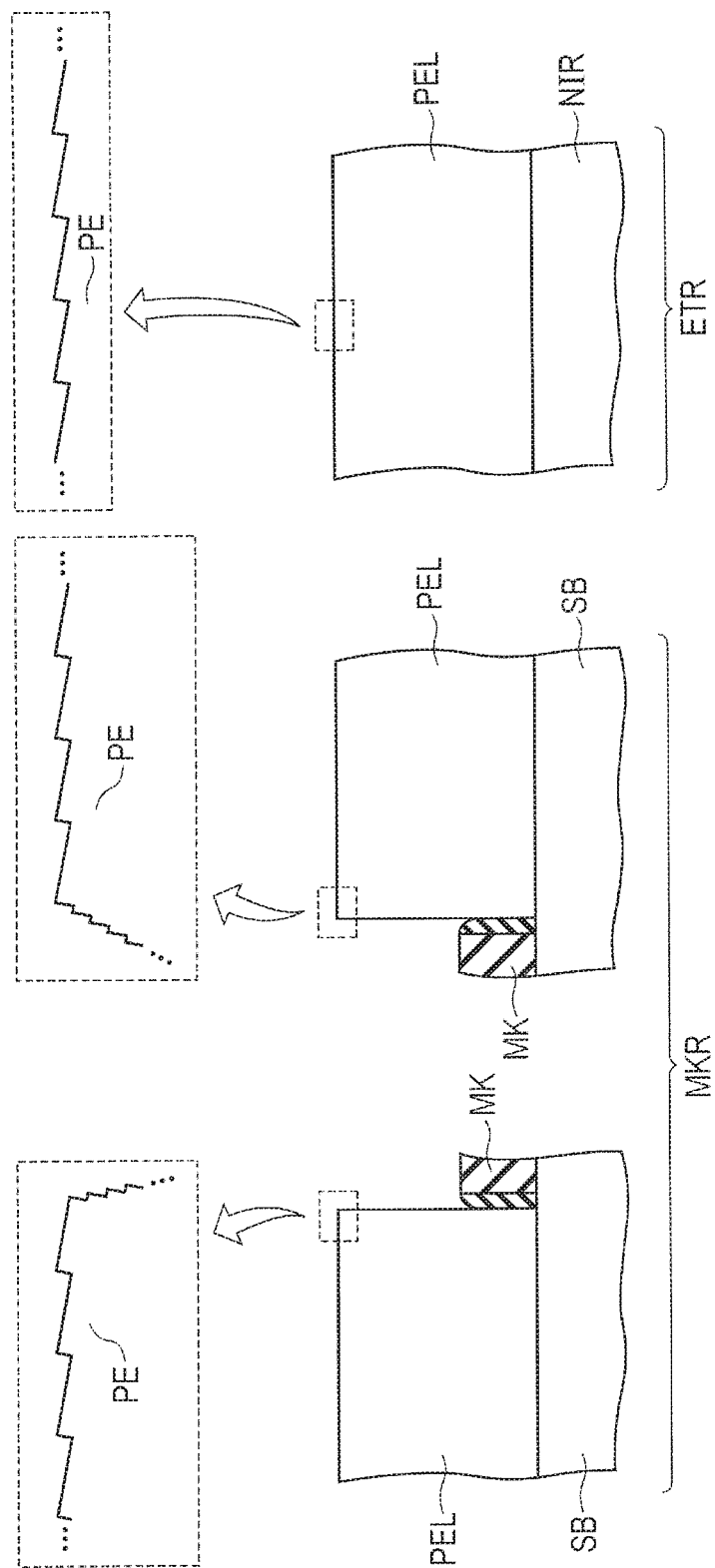
FIG. 13 is a partially enlarged cross sectional view schematically showing a surface state of a p-type epitaxial layer of a mark region and an element region, in the process illustrated in FIG. 12, in the same embodiment.

Descriptions will now be made to the surface of the P-type epitaxial layer PEL. The silicon substrate SB as a crystal substrate is sliced with an off-angle. The surface of the silicon substrate SB is inclined relative to a predetermined crystal orientation. Thus, as illustrated in dotted frames of FIG. 13, the surface of the P-type epitaxial layer PEL which is grown from the surface of the silicon substrate SB reflects the inclined surface of the silicon substrate SB, resulting in inclined surface morphology.

Figure 14:
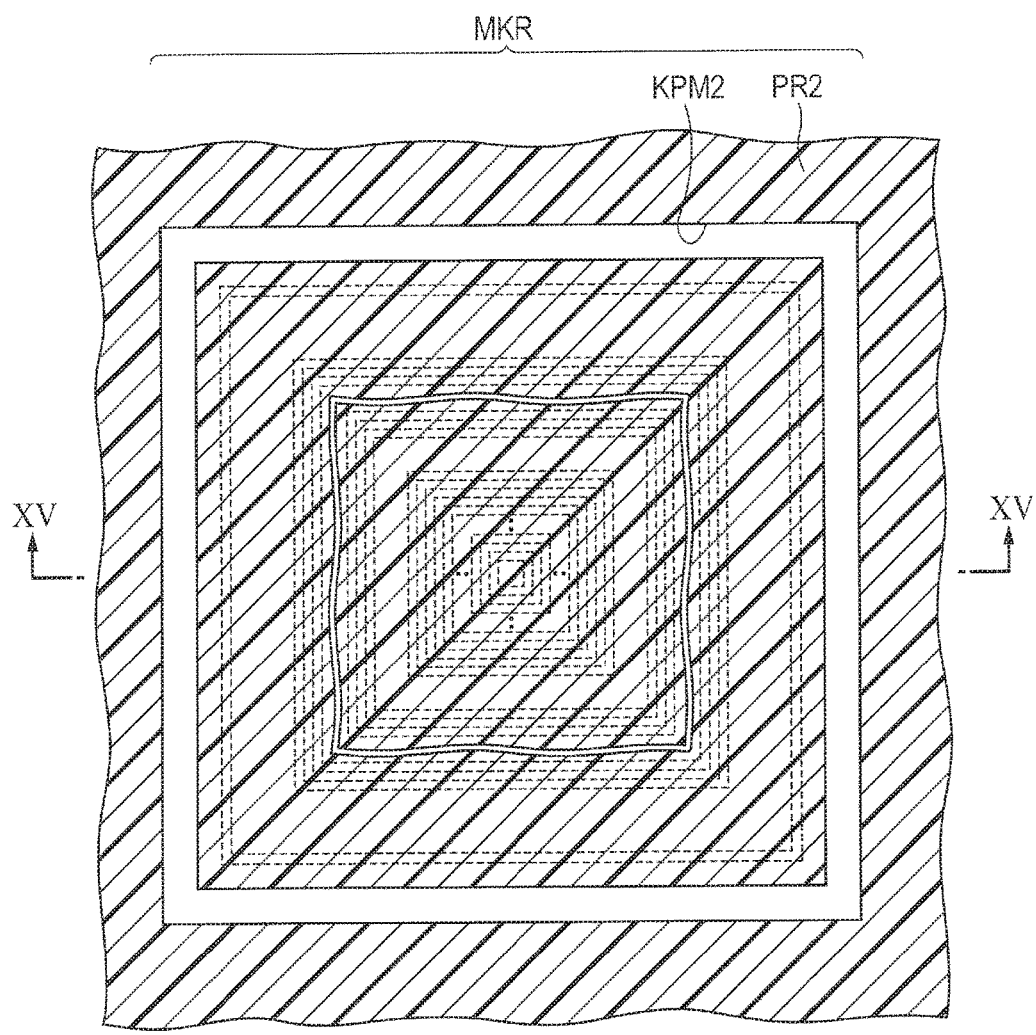
FIG. 14 is a partially enlarged cross sectional view showing the mark region in the process performed after the process illustrated in FIG. 12, in the same embodiment.
Figure 15:
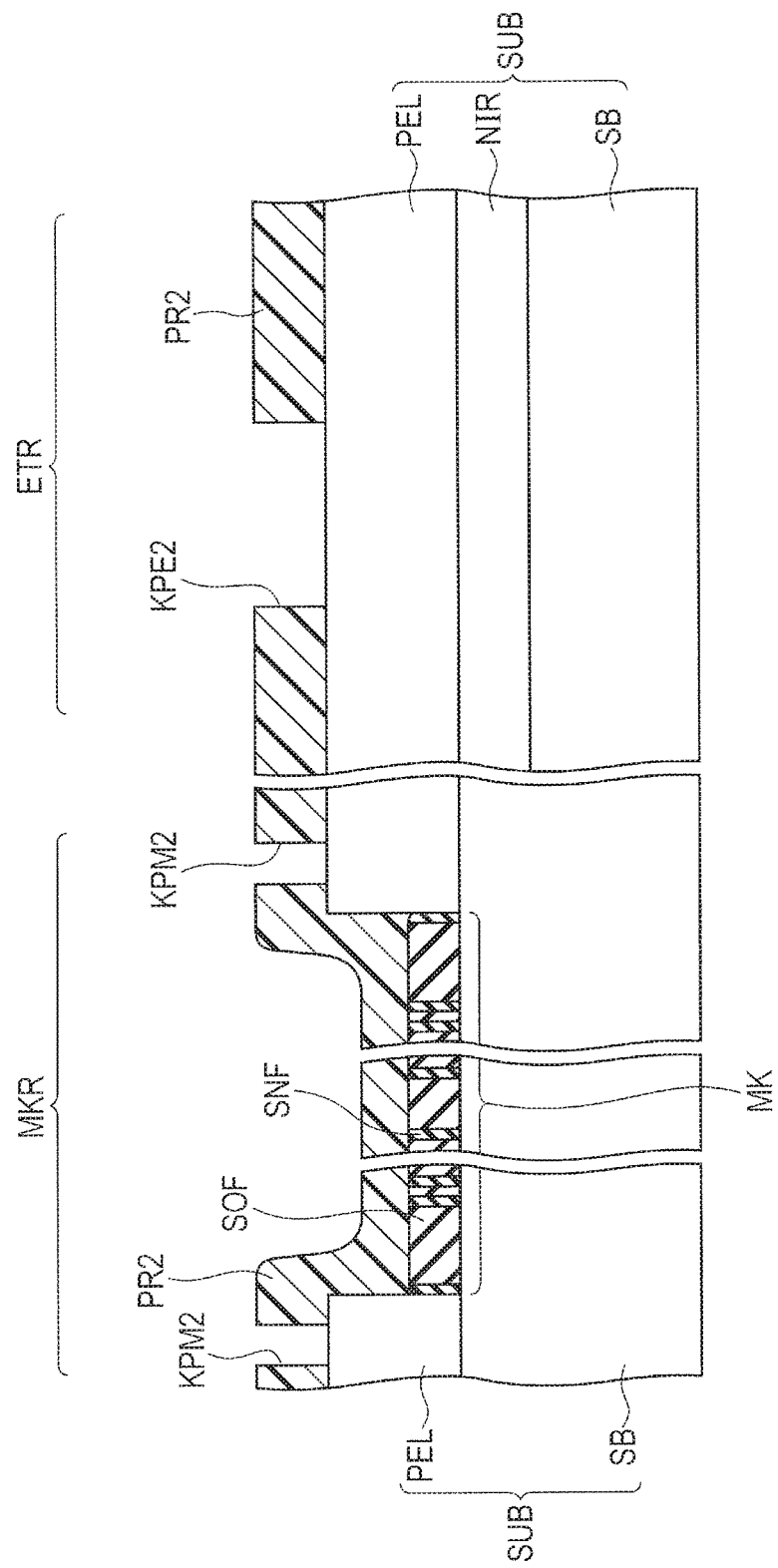
FIG. 15 is a cross sectional view showing a mark region and an element region in the process illustrated in FIG. 14, and including the cross sectional view taken along a line XV-XV illustrated in FIG. 14, in the same embodiment.

There is formed a photoresist pattern for forming the N-type impurity region NDR (see FIG. 2). A photoresist (not illustrated) is applied to cover the mark MK and the P-type epitaxial layer PEL. As illustrated in FIG. 14 and FIG. 15, a predetermined photoengraving process is performed, thereby forming a photoresist pattern PR2.

In the photoresist pattern PR2, an opening pattern KPE2 for exposing the P-type epitaxial layer PEL is formed in the element region ETR. In the mark region MKR, a rectangular opening pattern KPM2 is formed to surround the mark MK.

Superposition inspection is performed to determine whether the photoresist pattern PR2 has been formed in a predetermined position relative to the base pattern. The superposition inspection is performed by optically detecting the mark MK and the opening pattern KPM2, and comparing the center position of the mark MK and the center position of the rectangular opening pattern KPM2. As long as the deviation amount of the center positions is within a predetermined range, it is determined that the photoresist pattern PR2 is formed in a predetermined position relative to the base pattern.

Figure 16:
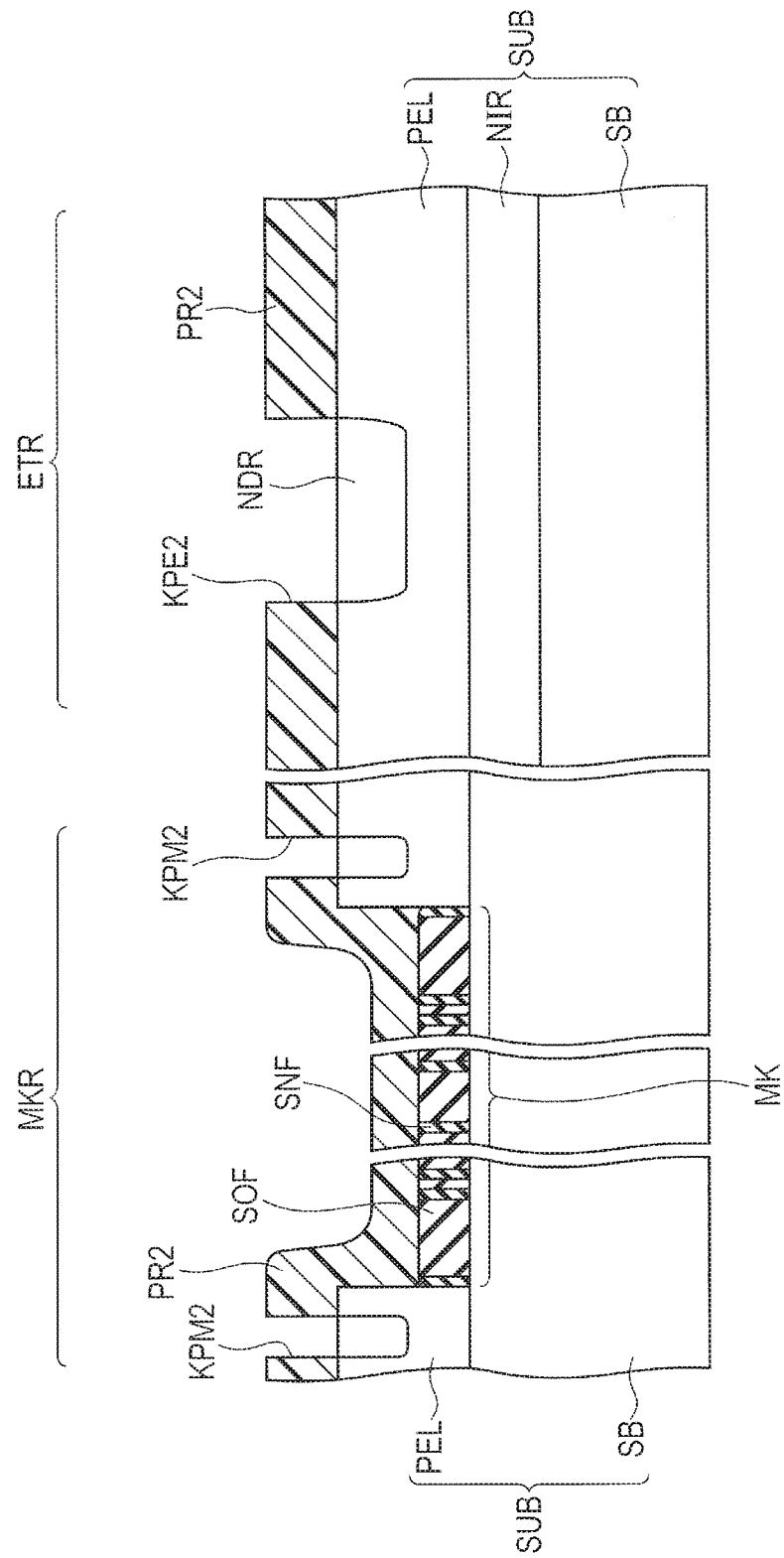
FIG. 16 is a cross sectional view showing a process performed after a process illustrated in FIG. 15, in the same embodiment.

As illustrated in FIG. 16, the N-type impurity region NDR is formed in the element region ETR by injecting N-type impurities, using the photoresist pattern PR2 as an injection mask. After this, the photoresist pattern PR2 is removed.

Figure 17:
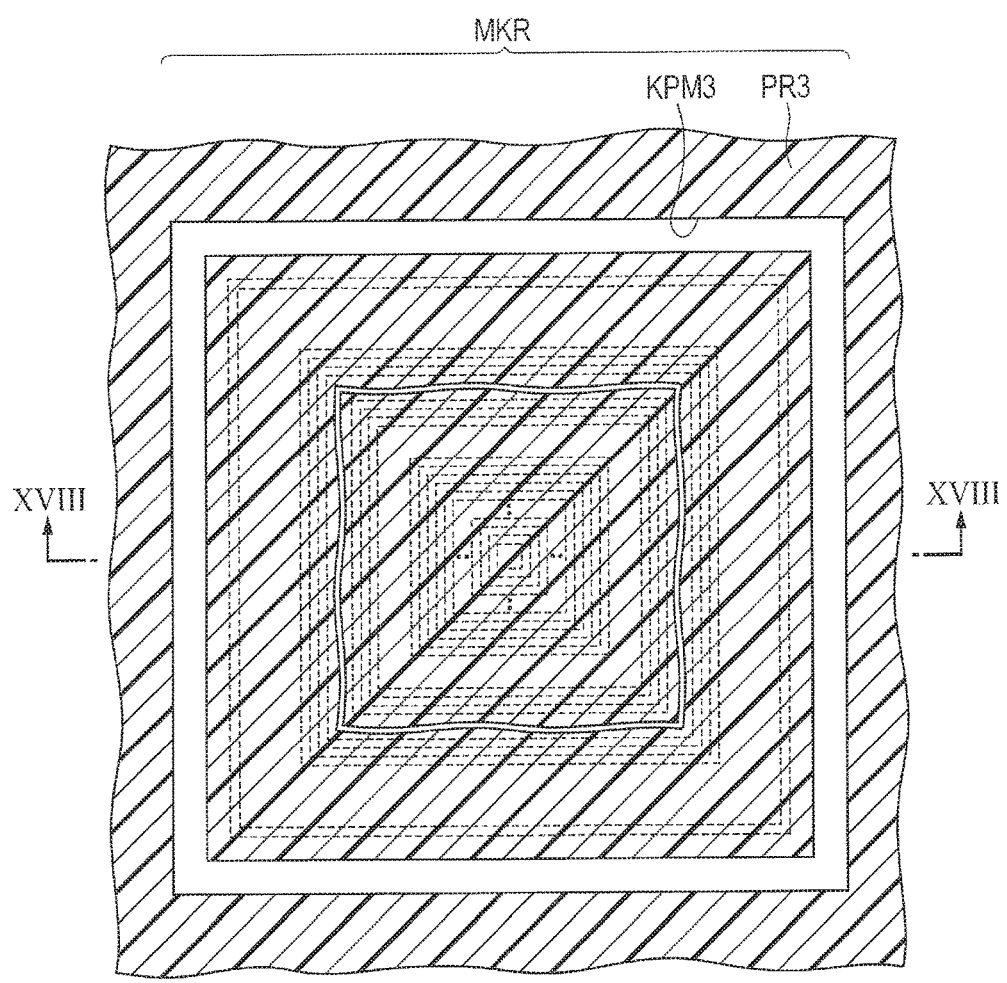
FIG. 17 is a partially enlarged cross sectional view showing the mark region in a process performed after the process illustrated in FIG. 16, in the same embodiment.
Figure 18:
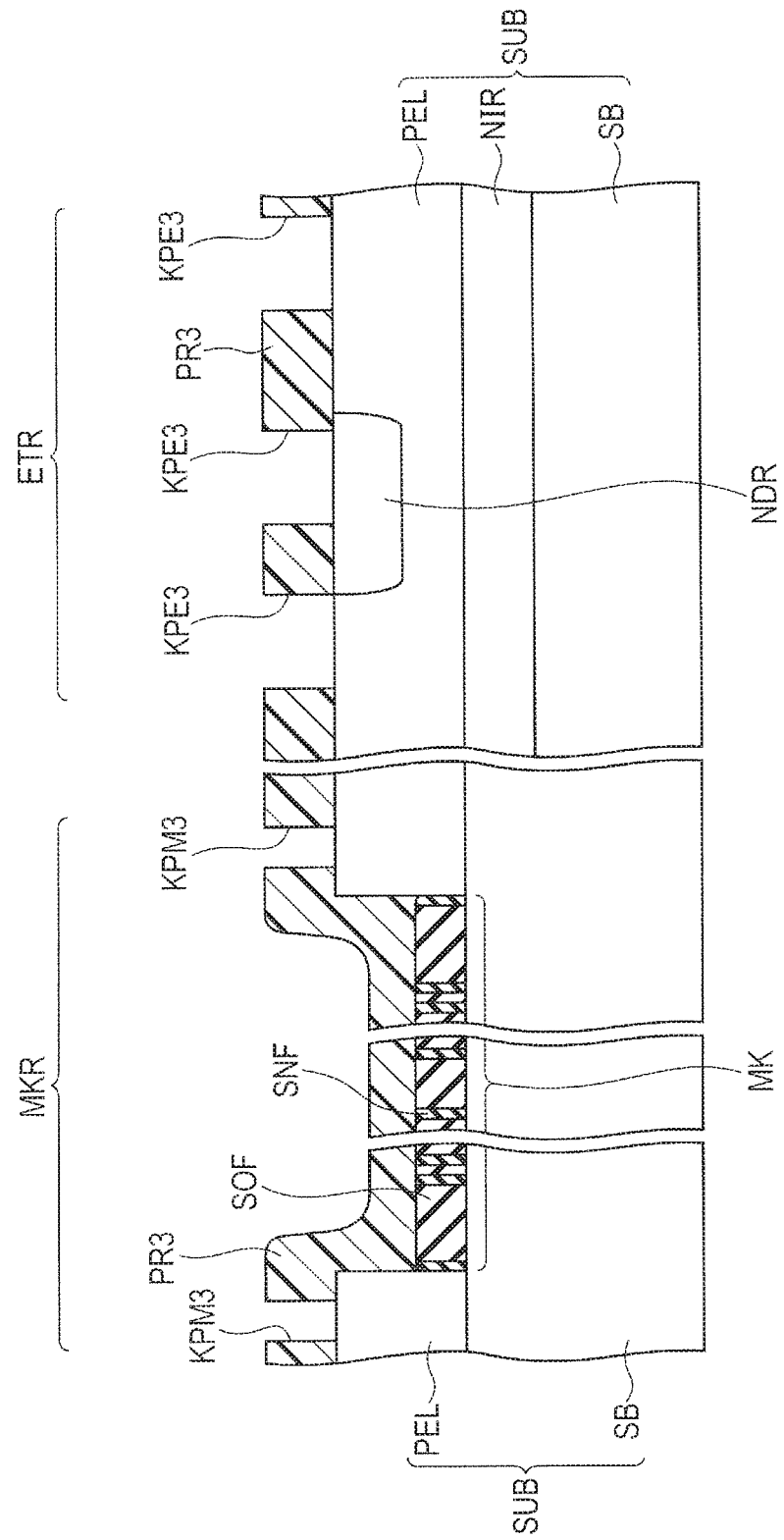
FIG. 18 is a cross sectional view showing the mark region and the element region in the process illustrated in FIG. 17, and including a cross sectional view taken along a line XVIII-XVIII illustrated in FIG. 17, in the same embodiment.

There is formed a photoresist pattern for forming the element region. A photoresist (not illustrated) is applied to cover the mark MK and the P-type epitaxial layer PEL. As illustrated in FIG. 17 and FIG. 18, a photoresist pattern PR3 is formed by performing a predetermined photoengraving process.

In the photoresist pattern PR3, there is formed the opening pattern KPE3 for exposing the P-type epitaxial layer PEL, in the element region ETR. In the mark region MKR, a rectangular opening pattern KPM3 is formed to surround the mark MK.

Superposition inspection is performed to determine whether the photoresist pattern PR3 has been formed in a predetermined position relative to the base pattern. The superposition inspection is performed by optically detecting the mark MK and the opening pattern KPM3, and comparing the center position of the mark MK and the center position of the rectangular opening pattern KPM3. As long as the deviation amount of the center positions is within a predetermined range, it is determined that the photoresist pattern PR3 has been formed in a predetermined position relative to the base pattern.

If the deviation amount of the center positions exceeds a predetermined range, it is determined that the photoresist pattern PR3 has not been formed in a predetermined position relative to the base pattern. In this case, the photoresist pattern PR3 is removed, and the photoengraving process is newly performed, thereby forming the photoresist pattern PR3.

The superposition inspection is performed for the newly formed photoresist pattern PR3. If the deviation amount of the center positions is within a predetermined range, it is determined that the photoresist pattern PR3 has been formed in a predetermined position relative to the base pattern. If the deviation amount of the center positions exceeds a predetermined range, the above process is repeatedly performed until it is within the predetermined range.

Figure 19:
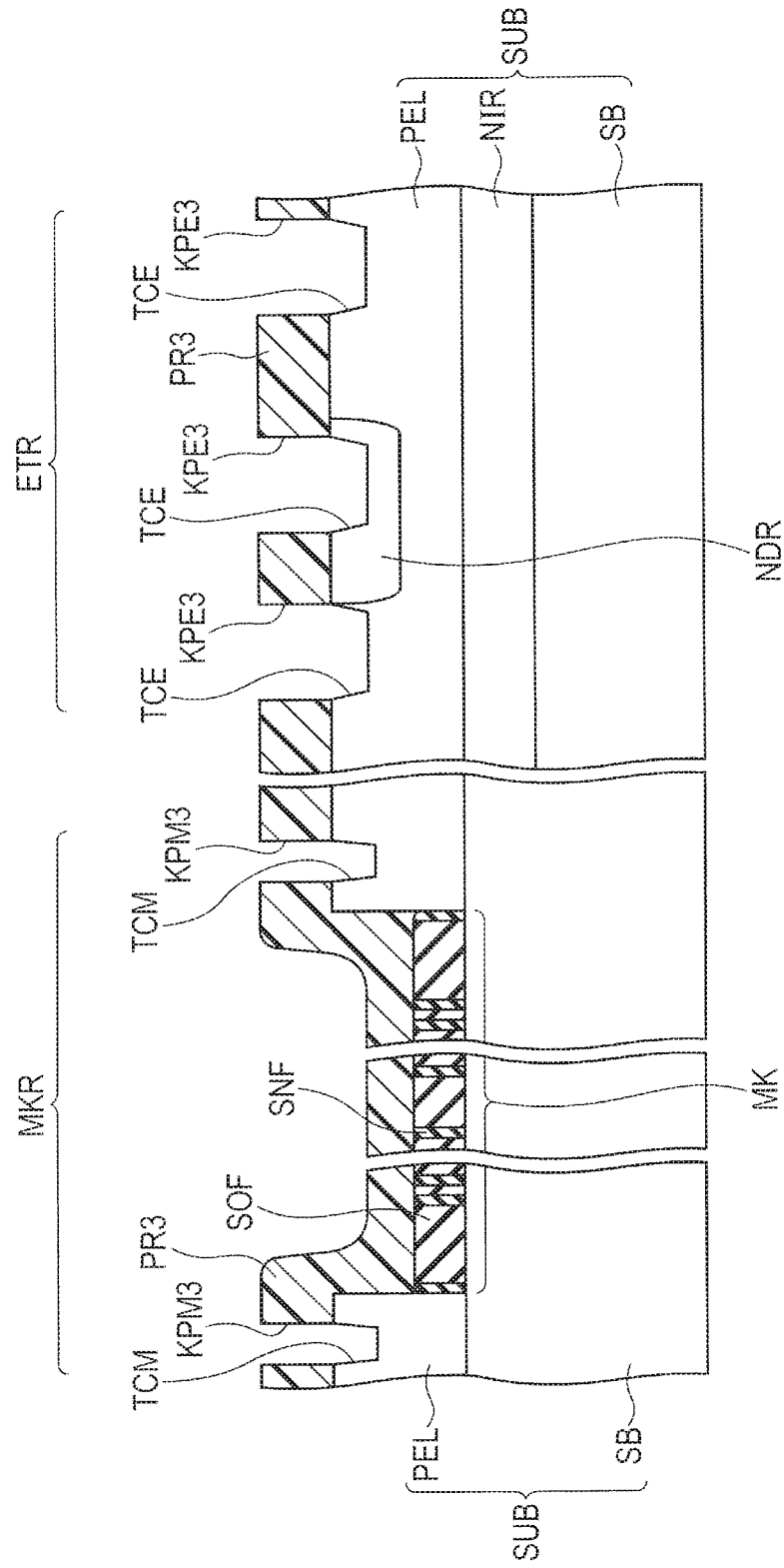
FIG. 19 is a cross sectional view showing a process performed after the process illustrated in FIG. 18, in the same embodiment.

As illustrated in FIG. 19, an etching process is performed for the exposed P-type epitaxial layer PEL, using the photoresist pattern PR3 as an etching mask. As a result, trenches TCE are formed in the element region ETR. In the mark region MKR, trenches TCM are formed to surround the mark MK. After this, the photoresist pattern PR3 is removed.

Figure 20:
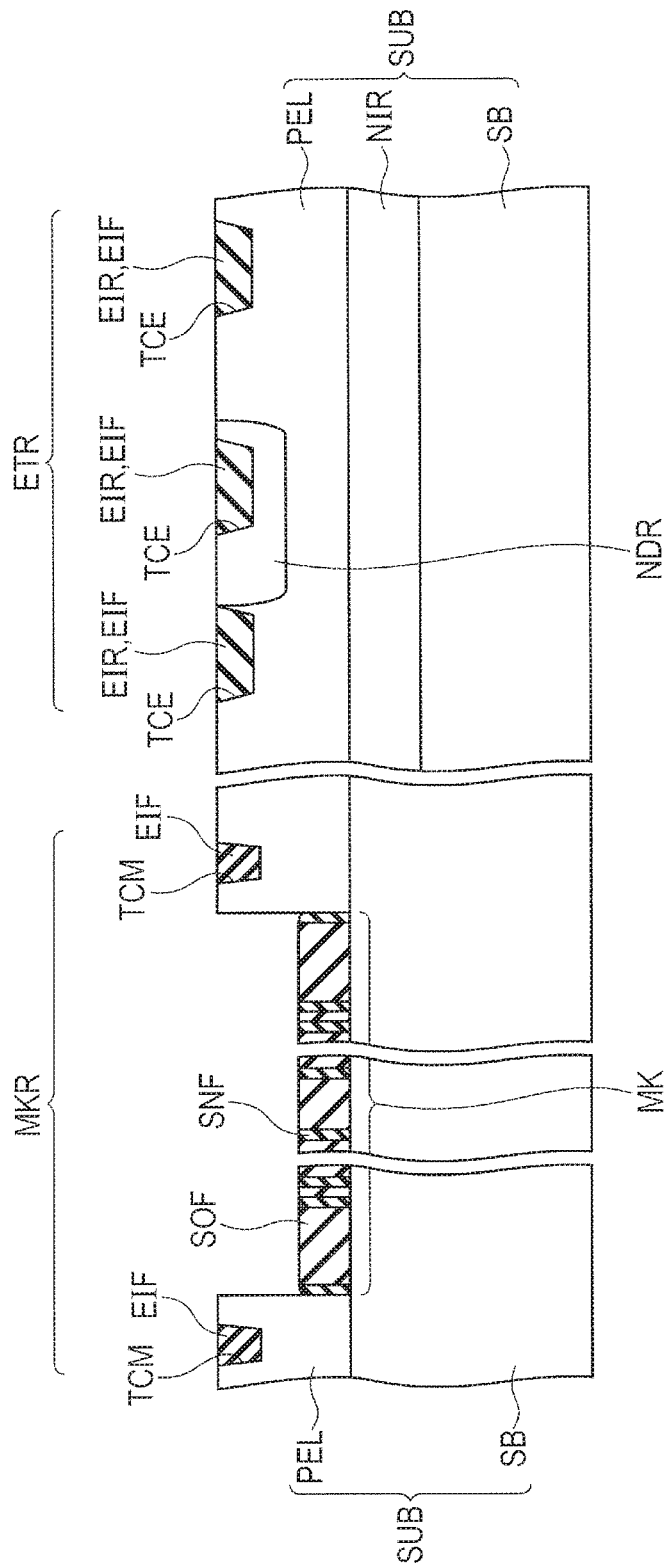
FIG. 20 is a cross sectional view showing a process performed after the process illustrated in FIG. 19, in the same embodiment.

As illustrated in FIG. 20, an element isolation insulating film EIF is formed in each of the trenches TCE and the trenches TCM. In the element region ETR, the element isolation region EIR is formed using the element isolation insulating film EIF formed in the trenches TCE.

A silicon oxide film (not illustrated) is formed over the surface of the P-type epitaxial layer PEL, using a thermal oxidation method. Then, a conductive film (not illustrated), for example, a polysilicon film is formed over the silicon oxide film.

Figure 21:
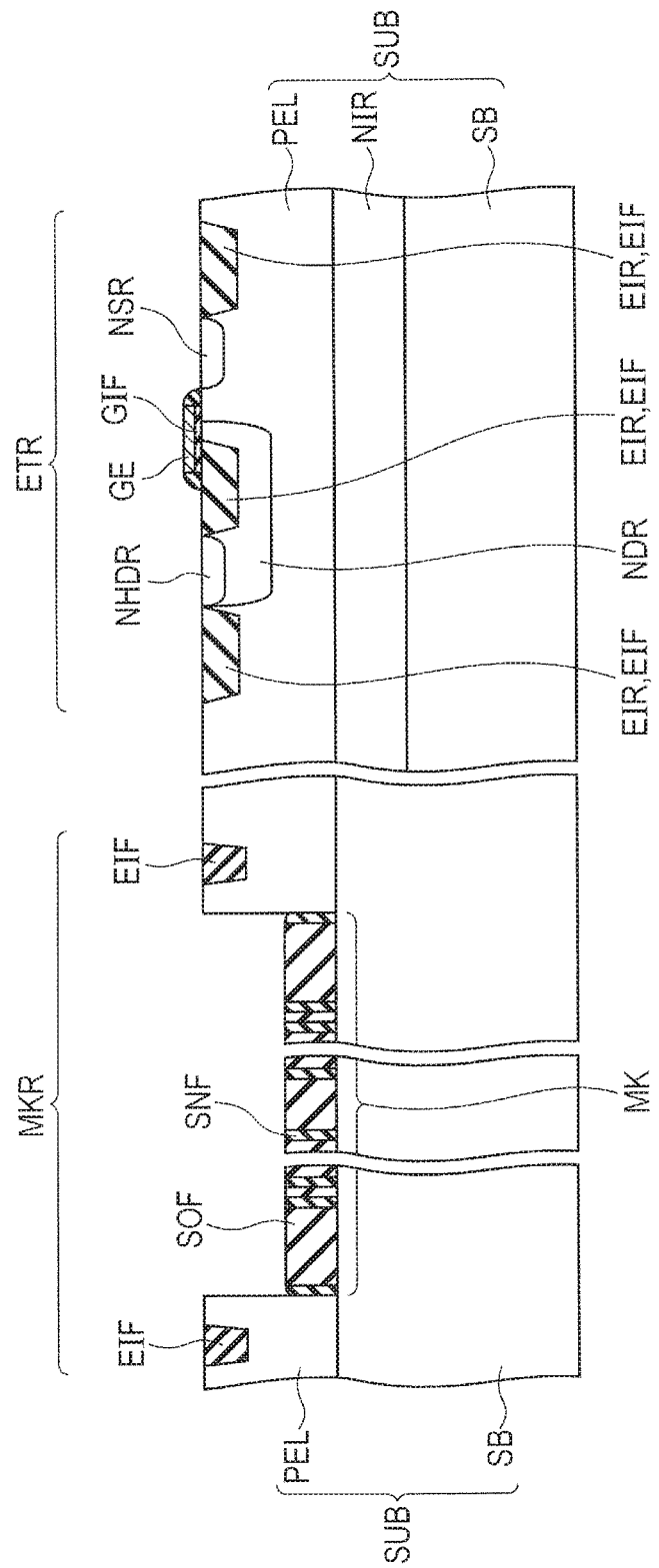
FIG. 21 is a cross sectional view showing a process performed after the process illustrated in FIG. 20, in the same embodiment.

As illustrated in FIG. 21, a predetermined photoengraving process and an etching process are performed. By so doing, the gate insulating film GIF intervenes over the P-type epitaxial layer PEL, to form the gate electrode GE. The predetermined photoengraving process is performed, thereby forming a photoresist pattern (not illustrated) as an injection mask.

The N-type impurities are injected, using the photoresist pattern as an injection mask, thereby forming the high concentration N-type impurity region NHDR having an impurity concentration higher than that of the N-type impurity region NDR, in the N-type impurity region NDR. The N-type impurity region NDR and the high concentration N-type impurity region NHDR are the drains of the high withstand voltage NMOS transistor HVNT. The N-type impurity region NSR is formed in the region of the P-type epitaxial layer PEL. The N-type impurity region NSR is the source of the high withstand voltage NMOS transistor HVNT.

Figure 22:
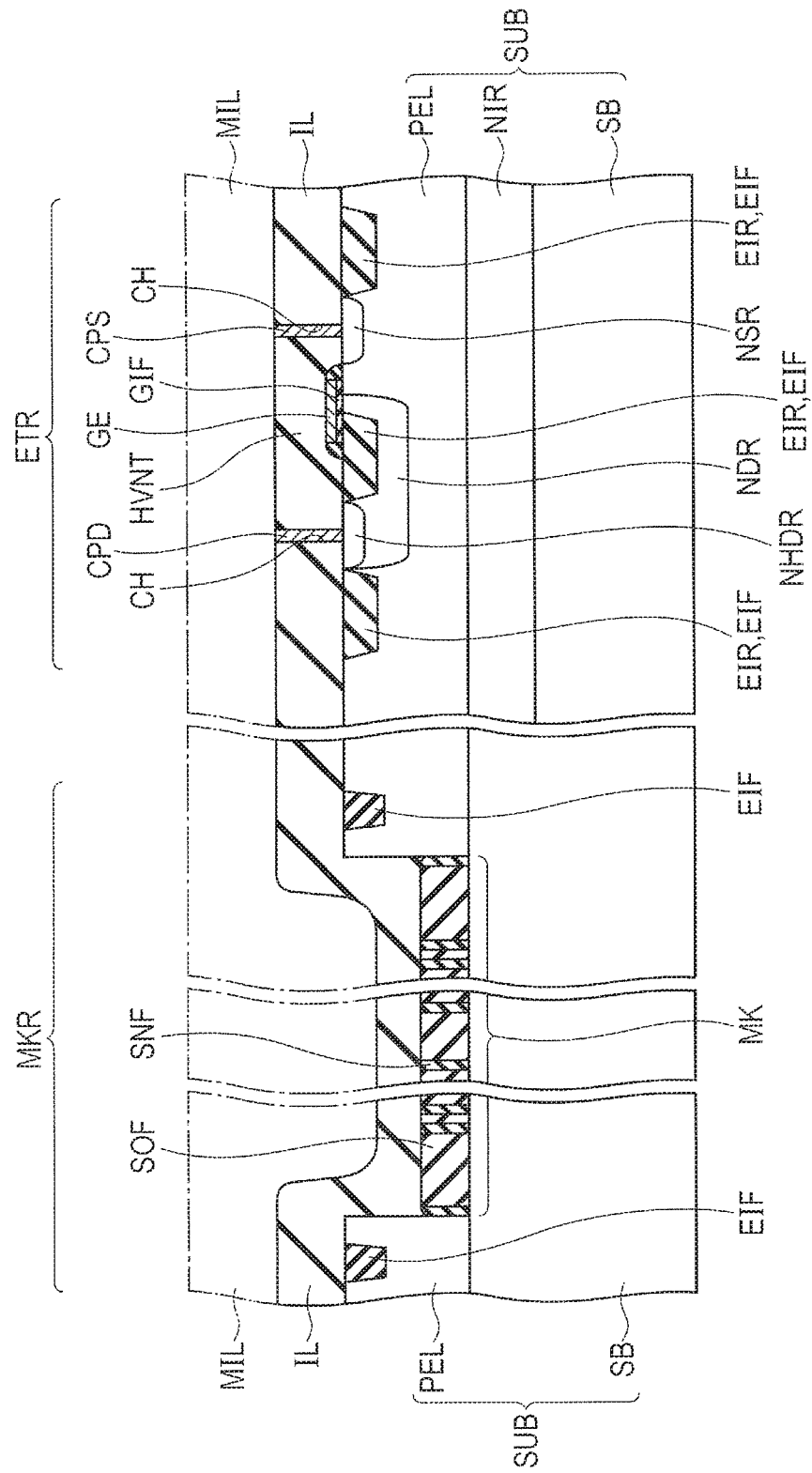
FIG. 22 is a cross sectional view showing a process performed after the process illustrated in FIG. 21, in the same embodiment.

As illustrated in FIG. 22, the interlayer insulating film IL, such as a silicon oxide film, is formed using, for example, a CVD method, to cover the high withstand voltage NMOS transistor HVNT and the mark MK. The predetermined photoengraving process and the etching process are performed, thereby forming contact holes CH penetrating through the interlayer insulating film IL, in the element region ETR.

In the contact holes CH, the contact plug CPD and the contact plug CPS are formed. The contact plug CPD is electrically coupled to the high concentration N-type impurity region NHDR. The contract plug CPS is electrically coupled to the N-type impurity region NSR.

There are formed a wiring (not illustrated) for electrically coupling to the contact plug CPD and a wiring (not illustrated) for electrically coupling to the contact plug CPS. After this, there is formed a multilayer wiring structure MIL including a multilayer wiring and an interlayer insulating film for insulating in the multilayer wiring, as needed. In this manner, the main parts of the semiconductor device are completed.

In the mark region MKR in the above semiconductor device, the P-type epitaxial layer PEL is not grown in the region where the mark MK is arranged. This enables to improve the accuracy of the superposition inspection of the photoengraved photoresist patterns. This will be described as compared with a semiconductor device according to a comparative example.

Figure 23:
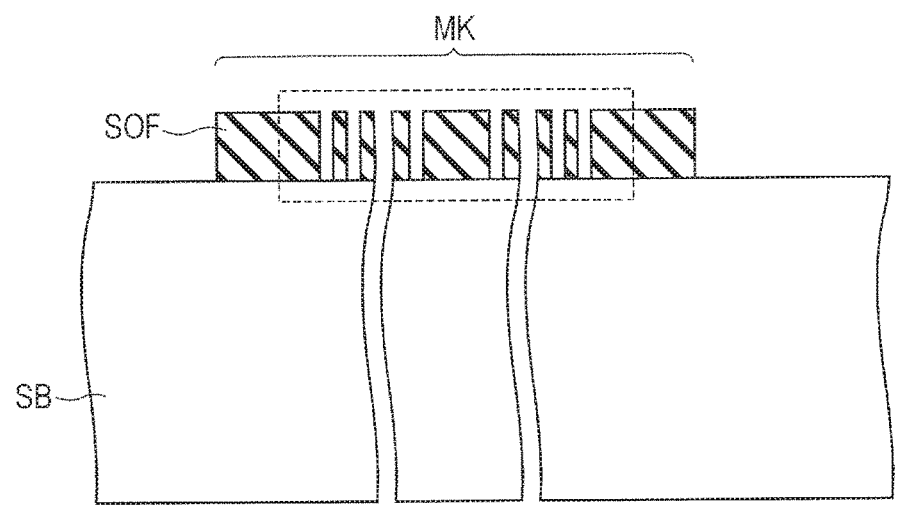
FIG. 23 is a partially enlarged cross sectional view showing a mark region, in one process of a manufacturing method of a semiconductor device according to a comparative example.

In the semiconductor device according to the comparative example, there is formed the mark MK which is formed from a silicon oxide film SOF over the surface of the silicon substrate SB, as illustrated in FIG. 23, through the same process as the above process illustrated in FIG. 3 to FIG. 7. In the mark MK (silicon oxide film SOF), a plurality of rectangular groove patterns TP are concentrically formed. On the bottom of the groove patterns TP, the surface of the silicon substrate SB is exposed.

After the same process as the process illustrated in FIG. 11, the P-type epitaxial layer PEL is formed on the surface of the exposed silicon substrate SB, using the epitaxial growth method. At this time, in the mark region MKR, silicon is grown also from the surface of the silicon substrate SB exposed between the silicon oxide film SOF and the silicon oxide film SOF.

Figure 24:
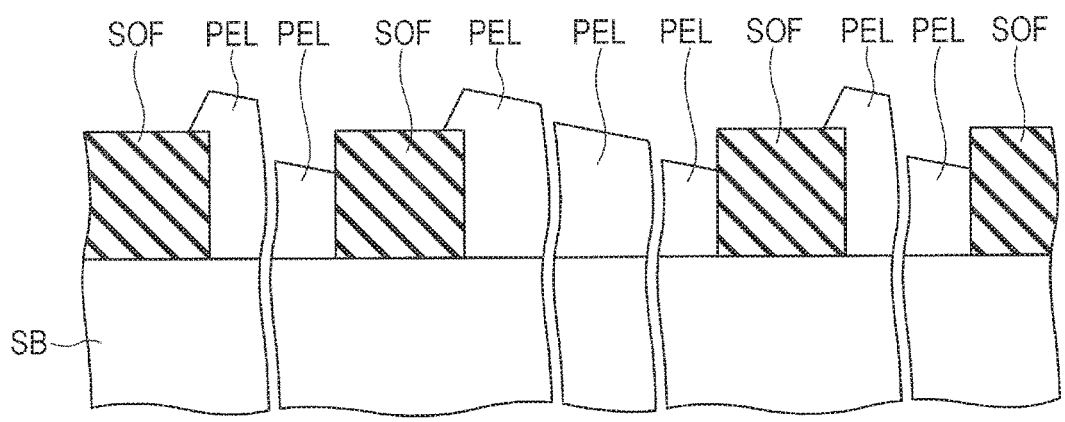
FIG. 24 is a partially enlarged cross sectional view showing a process performed after the process illustrated in FIG. 23, and is a partially enlarged cross sectional view for explaining a problem of the semiconductor device according to the comparative example.

As described above, the surface of the silicon substrate SB as a crystal substrate is inclined in accordance with an off-angle relative to a predetermined crystal orientation. Thus, as illustrated in FIG. 24, the P-type epitaxial layer PEL is grown while being inclined in a particular direction, from the surface of the silicon substrate SB exposed to the bottom of the rectangular groove patterns. That is, the P-type epitaxial layer PEL is grown while being inclined in a particular direction, in the region where the mark MK is arranged.

There is formed a photoresist pattern (not illustrated) for forming the element isolation region, through the same process as the process illustrated in each of FIG. 14 to FIG. 18. In the photoresist pattern, there is formed an opening pattern (an opening pattern A) corresponding to the opening pattern KPM3 (see FIG. 17 and FIG. 18), to surround the mark MK.

Superposition inspection is performed to determine whether the photoresist pattern has been formed in a predetermined position relative to the base pattern. The superposition inspection is performed by optically inspecting the mark MK and the opening pattern A, and comparing the center position of the mark MK and the center position of the rectangular opening pattern A.

At this time, the P-type epitaxial layer PEL (see FIG. 24) which has been grown while being inclined in a particular direction is positioned in the region of the mark MK. Thus, predetermined light is irradiated to the mark MK, and the center position (coordinates) of the mark MK is optically detected. At this time, the accuracy of detecting the coordinates may be decreased. This may result in decreasing the accuracy of the superposition inspection for determining whether the photoresist pattern has been formed in a predetermined position relative to the base pattern.

Figure 25:
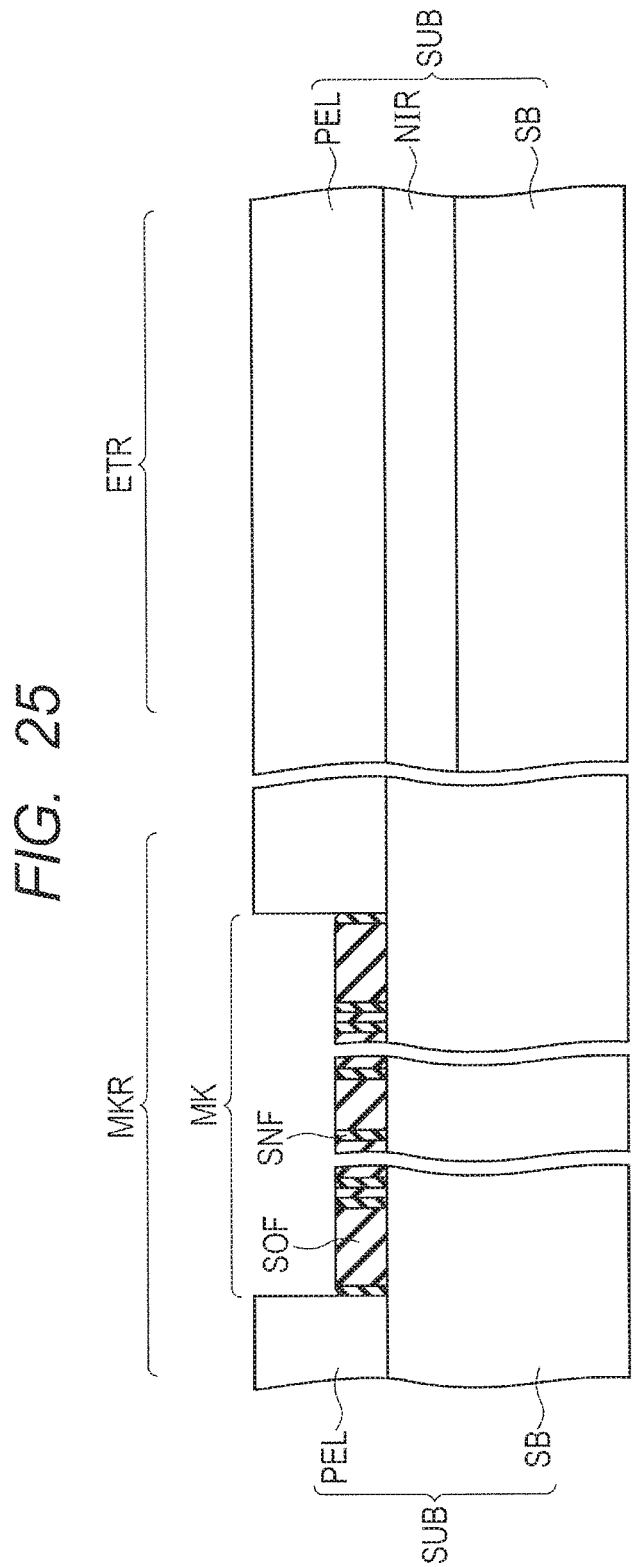
FIG. 25 is a cross sectional view showing one process of a manufacturing method of a semiconductor device, for explaining a functional effect of the semiconductor device, in the same embodiment.

As compared with the semiconductor device according to the comparative example, in the semiconductor device according to the embodiment 1, as illustrated in FIG. 25, the surface of the silicon substrate SB is covered by the silicon oxide film SOF and the silicon nitride film SNF, in the region where the mark MK is arranged. Therefore, the P-type epitaxial layer PEL is not grown in the region where the mark MK is arranged.

Figure 26:
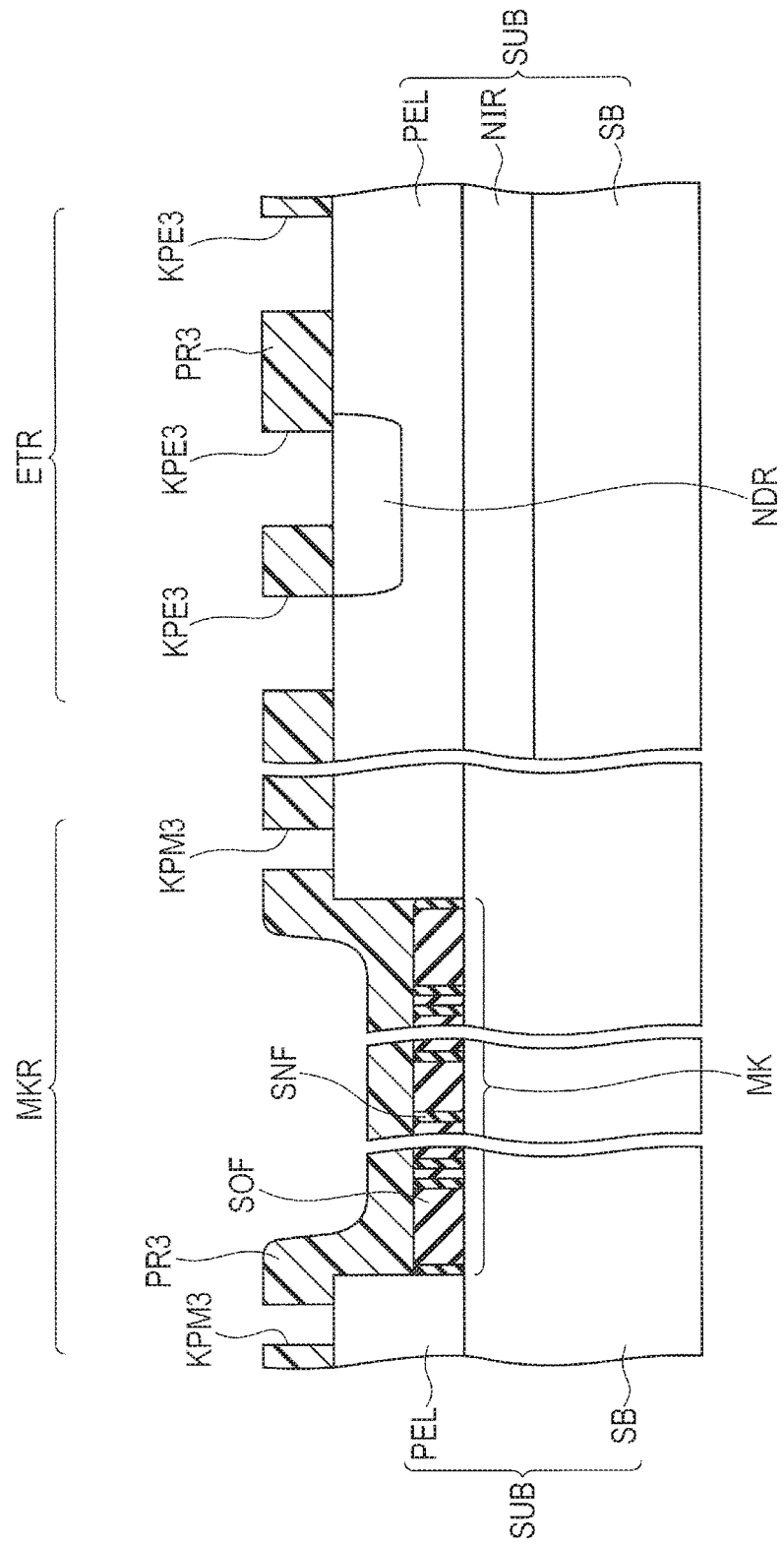
FIG. 26 is a cross sectional view showing a process performed after the process illustrated in FIG. 25, for explaining the functional effect of the semiconductor device, in the same embodiment.
Figure 27:
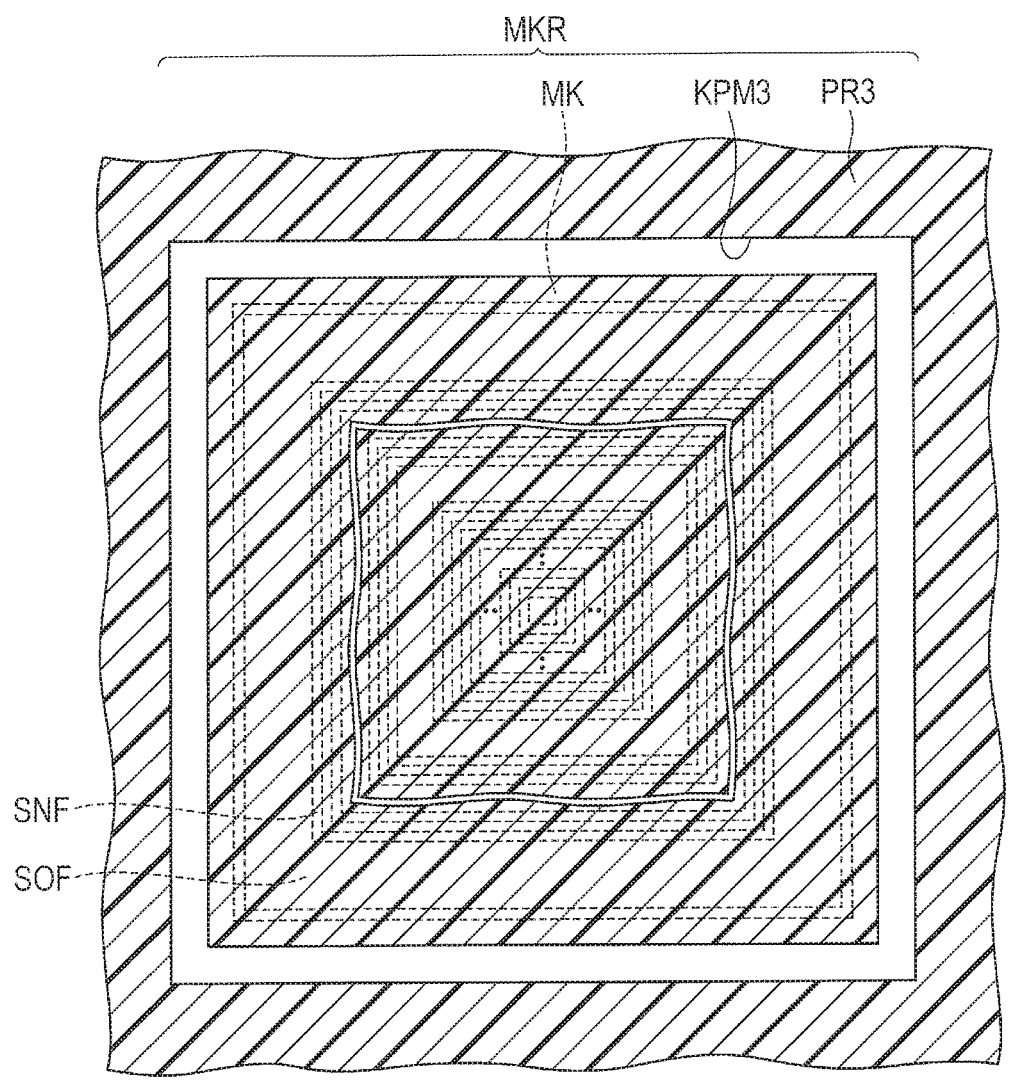
FIG. 27 is a partially enlarged cross sectional view showing a mark region in the process illustrated in FIG. 26, for explaining the functional effect of the semiconductor device, in the same embodiment.

After this, the superposition inspection is performed for the photoresist pattern PR3 for forming the element isolation region. At this time, as illustrated in FIG. 26 and FIG. 27, the rectangular silicon nitride film SNF is concentrically arranged in the region of the silicon oxide film SOF, in the mark region MKR.

As a result, it is possible to attain the contrast due to a difference in the refractive indexes of the silicon oxide film SOF and the silicon nitride film SNF, and to increase the detection accuracy of the center position (coordinates) of the mark MK. That is, it is possible to measure, with high accuracy, the deviation amount of the center position (coordinates) of the mark M and the center position (coordinates) of the opening pattern KPM3 of the photoresist pattern PR3.

As a result, it is possible to improve the accuracy of the superposition inspection for determining whether the photoresist pattern PR3 has been formed in a predetermined position relative to the base pattern. The mark MK is formed by forming the silicon nitride film SNF after patterning the silicon oxide film SOF and performing a whole surface etch back process. By so doing, it is possible to minimize an increase in the manufacturing cost.

The descriptions have been made to the superposition inspection for the photoresist pattern PR3 for forming the element isolation region, by way of example. The same applies to the superposition inspection for the photoresist pattern PR2 for forming the N-type impurity region NDR.

Figure 28:
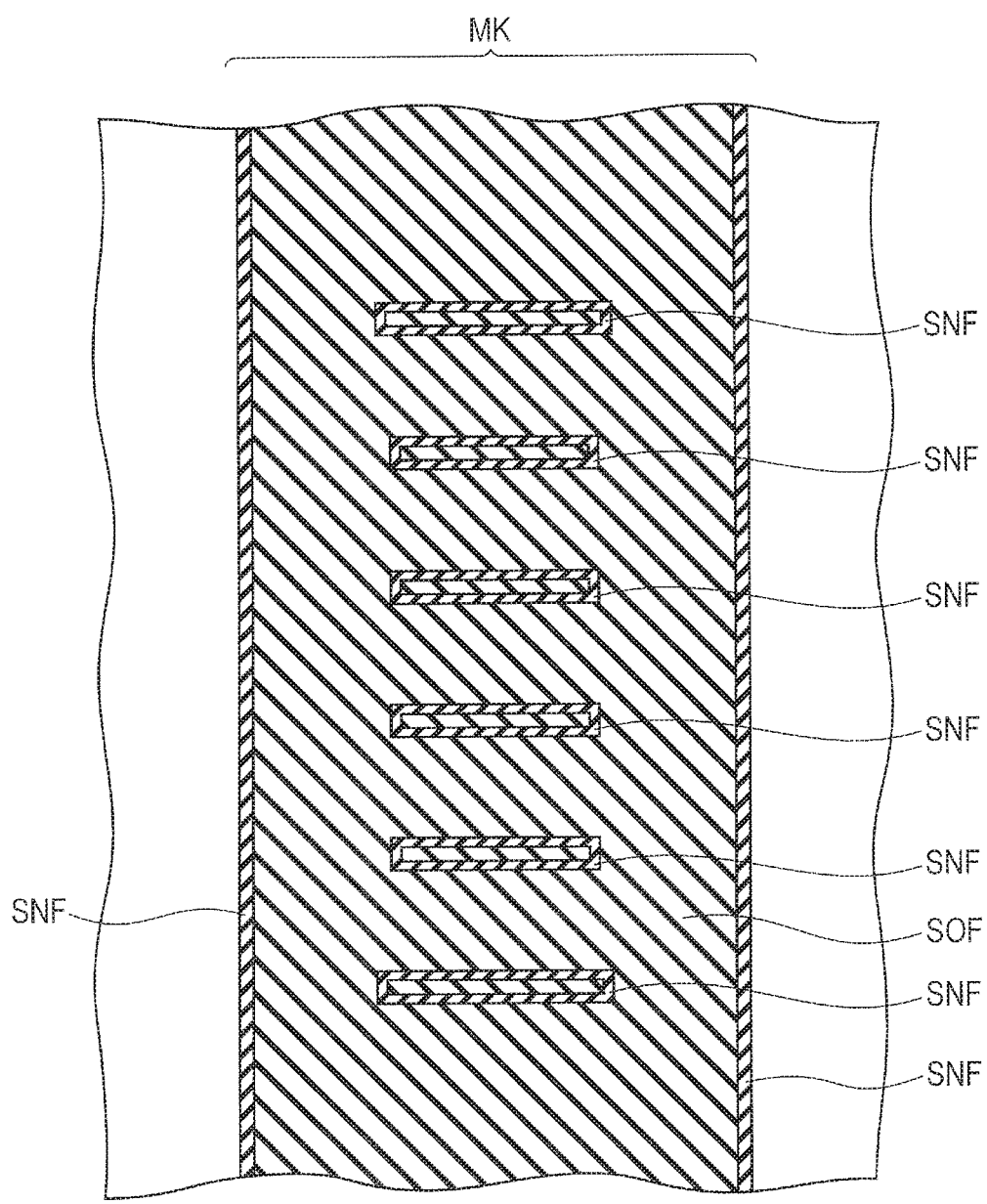
FIG. 28 is a partially enlarged cross sectional view showing an example of an alignment mark formed in the mark region, as a modification, in the same embodiment.

The descriptions have been made to the case in which the mark MK is used for the superposition inspection for the photoresist pattern formed using the photoengraving process, by way of example. Other than this example, it is possible to use the mark as an alignment mark, for positioning the photo mask at the time of photoengraving process. FIG. 28 illustrates an example of the pattern of this alignment mark.

As illustrated in FIG. 28, a plurality of rectangular patterns having a width in a Y direction and extending in an X direction are formed at spaces in the Y direction. In this mark MK, the silicon nitride film SNF is formed in the grooves formed in the silicon oxide film SOF.

Figure 29:
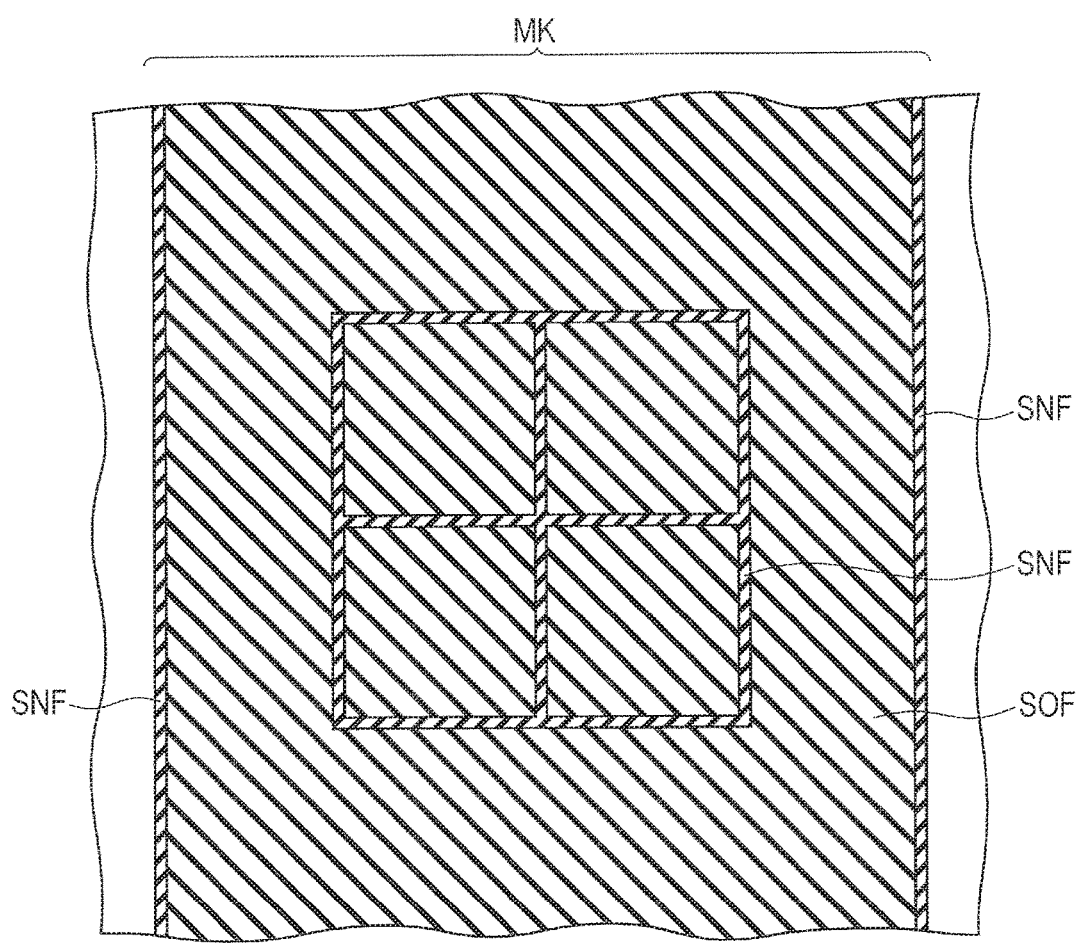
FIG. 29 is a partially enlarged cross sectional view showing another example of the alignment mark formed in the mark region, as a modification, in the embodiment.

FIG. 29 illustrates another example of the pattern of the alignment mark. As illustrated in FIG. 29, the silicon nitride film SNF is formed to divide the region of the silicon oxide film SOF surrounded by the silicon nitride film SNF, into four.

In any of the alignment marks, the epitaxial layer is not formed in the region where the alignment mark is formed. Like the case of the superposition inspection, it is possible to improve the positioning accuracy of the photo mask.

In the above-described semiconductor device, by way of example, the groove patterns are formed in the silicon oxide film, and the silicon nitride film is formed in the groove patterns, thereby forming the mark. However, it is possible to form the mark by forming the groove pattern in the silicon nitride film, and embedding the silicon oxide film in the groove pattern.

When the element isolation region is formed using a LOCOS (Local Oxidation of Silicon) method for element isolation, the silicon nitride film formed at the time of forming the element isolation region can be used as a part of an insulating film to be a mark. That is, this can contribute to process reduction. Of the manufacturing processes of the semiconductor device, in the first some processes, if there is any process for forming the silicon oxide film or the silicon nitride film, the mark may be formed simultaneously with the corresponding process.

Further, as the above-described method for using the mark, the descriptions have been made to the case applied to the manufacturing of the semiconductor device including the high withstand voltage transistor. Other than this, when it is assumed that symmetry of the mark form breaks down due to the epitaxial growth method, it is possible to apply the above-described mark, even in another crystal substrate other than the silicon substrate. It is possible to apply the above mark, even when the epitaxial layer is further grown, for example, in the crystal layer formed over a glass substrate.

Embodiment 2

Descriptions will now be made to an example of a semiconductor device including a mark, for improved inspection accuracy of superposition inspection.

Figure 30:
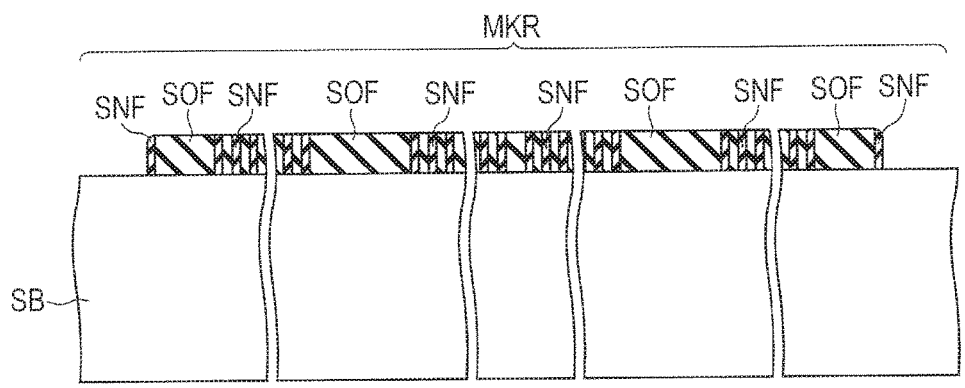
FIG. 30 is a partially enlarged cross sectional view of the mark region, showing one process of a manufacturing method of a semiconductor device according to an embodiment 2.
Figure 31:
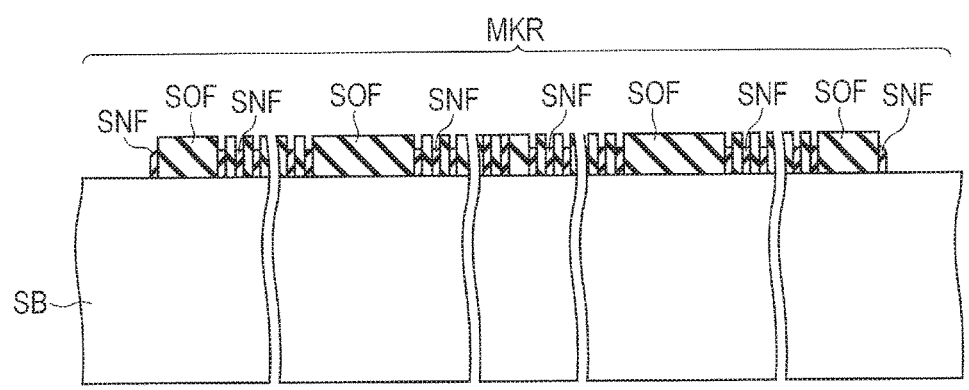
FIG. 31 is a partially enlarged cross sectional view showing a process performed after the process illustrated in FIG. 30, in the same embodiment.
Figure 32:
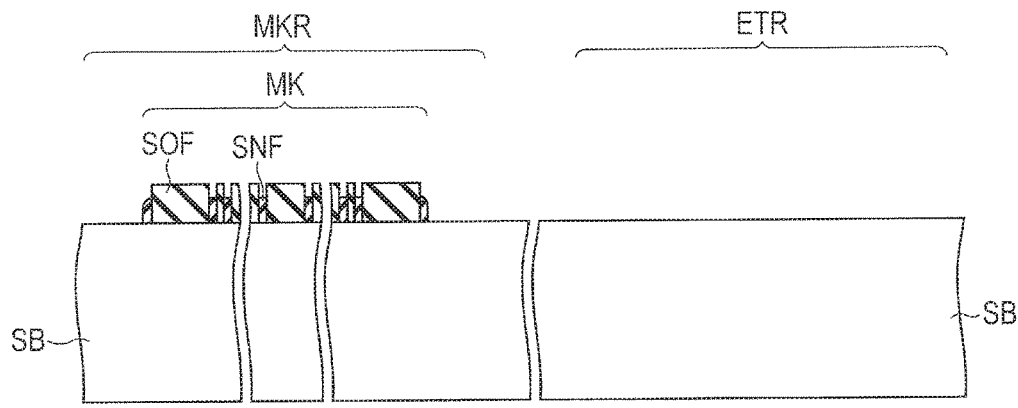
FIG. 32 is a cross sectional view showing a mark region and an element region in the process illustrated in FIG. 31, in the same embodiment.

Descriptions will now be made to its manufacturing method. The silicon nitride film SNF is formed to cover the silicon oxide film SOF (see FIG. 8), through the same process as the process of each of FIG. 3 to FIG. 8. As illustrated in FIG. 30, a whole surface etch back process is performed for the silicon nitride film SNF, thereby removing a part of the silicon nitride film SNF positioned over the upper surface of the silicon oxide film SOF. As illustrated in FIG. 31 and FIG. 32, subsequently, an etching process (over-etching) is performed, thereby causing the upper surface of the silicon nitride film SNF to be in a position lower than the upper surface of the silicon oxide film SOF.

Figure 33:
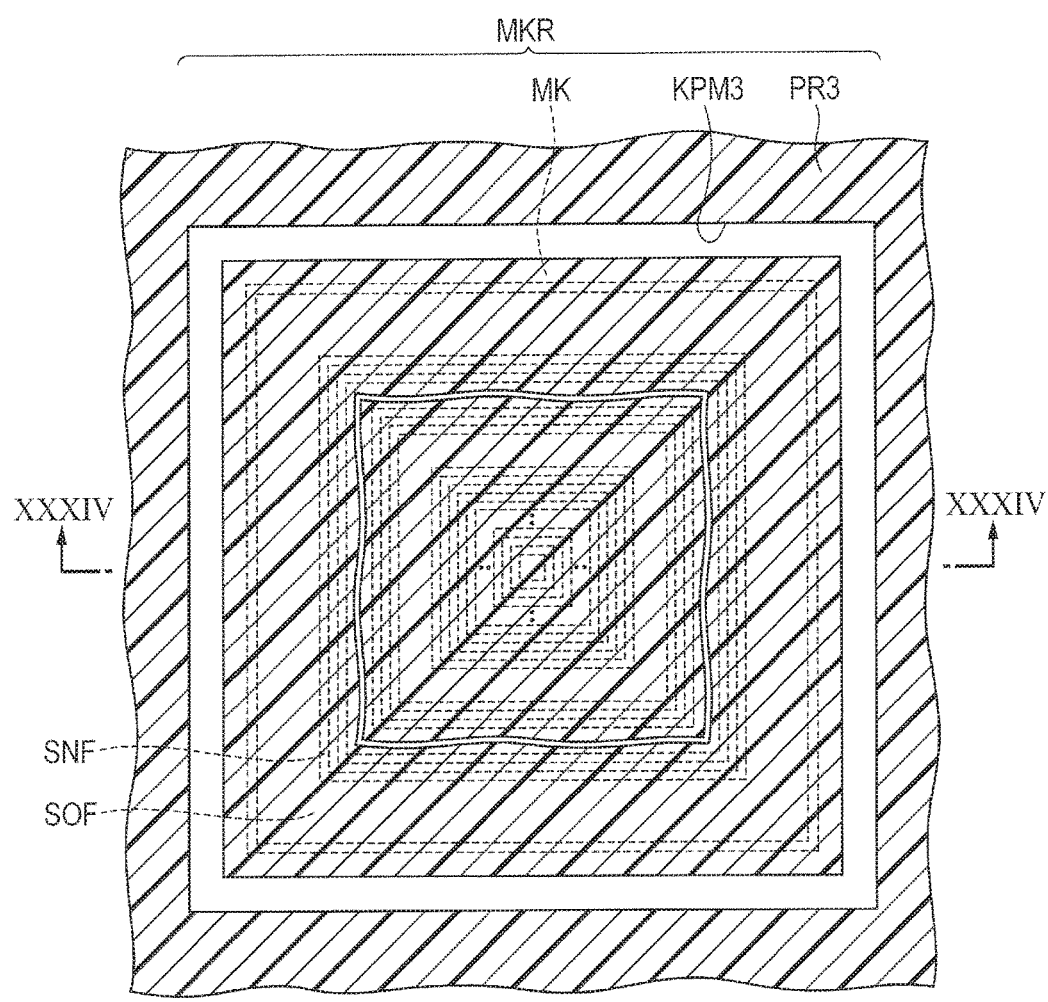
FIG. 33 is a partially enlarged cross sectional view showing a mark region in a process performed after the process illustrated in FIG. 32, in the embodiment.
Figure 34:
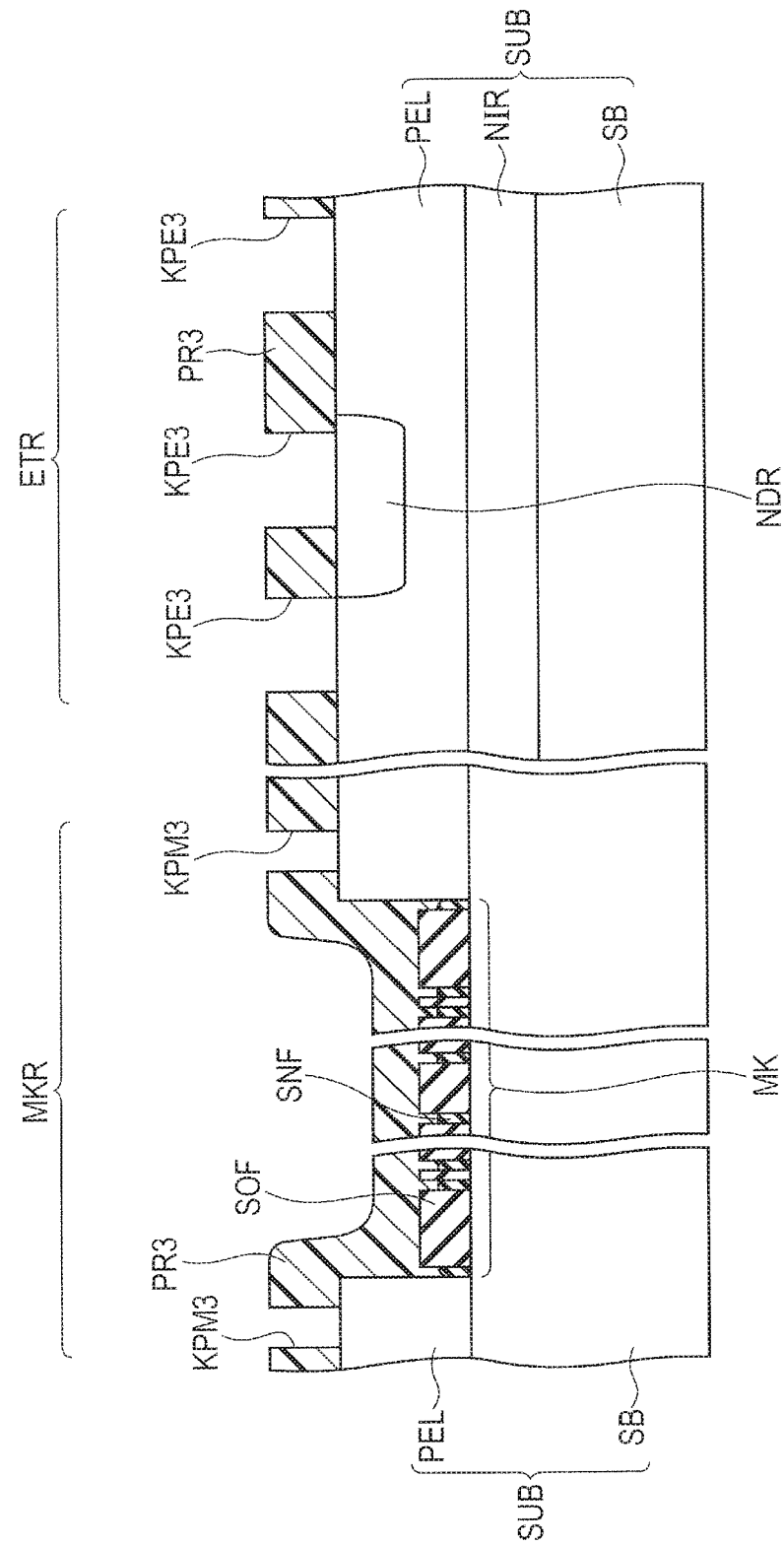
FIG. 34 is a cross sectional view showing the mark region and an element region in the process illustrated in FIG. 33, and including a cross sectional view taken along a line XXXIV-XXXIV illustrated in FIG. 33, in the same embodiment.

The photoresist pattern PR3 for forming the element isolation region is formed, as illustrated in FIG. 33 and FIG. 34, through the same process as the process illustrated in each of FIG. 12 to FIG. 18. In the photoresist pattern PR3, the opening pattern KPM3 is formed to surround the mark MK.

Figure 35:
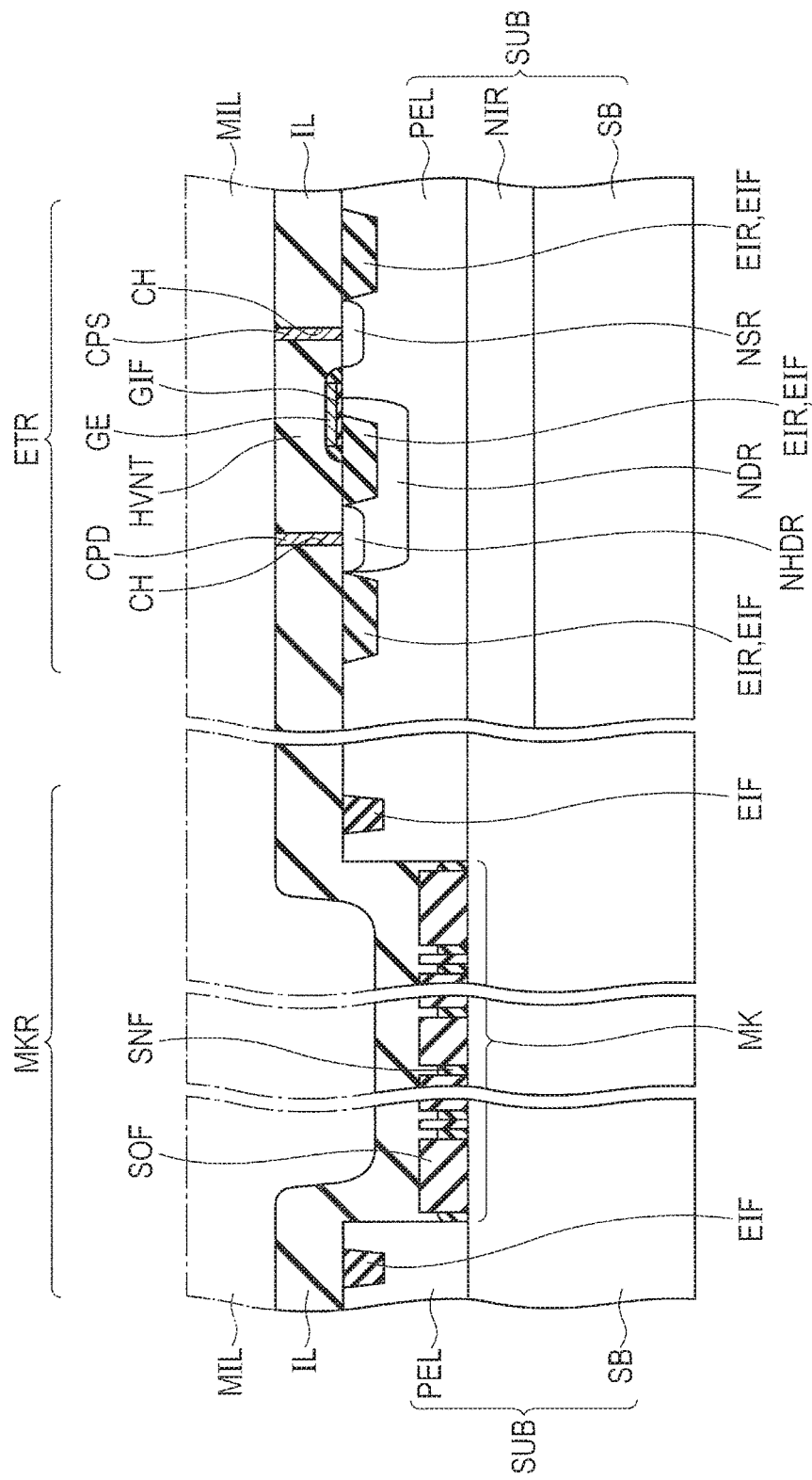
FIG. 35 is a cross section view showing a process performed after the process illustrated in FIG. 34, and is a cross sectional view showing a semiconductor device according to the same embodiment, in the same embodiment.

Superposition inspection is performed for the photo resist pattern PR3. At this time, as will be described later, it is possible to further improve the accuracy of the superposition inspection, if the upper surface of the silicon nitride film SNF is in a position lower than that of the upper surface of the silicon oxide film SOF. After this, as illustrated in FIG. 35, the main parts of the semiconductor device including the high withstand voltage NMOS transistor HUNT are completed, through the same process as the process illustrated in each of FIG. 19 to FIG. 21.

In the above-described semiconductor device, the upper surface of the silicon nitride film SNF in the mark MK is in a position lower than the upper surface of the silicon oxide film SOF. Thus, in the superposition inspection for the photoresist pattern PR3, there is a high percentage of light reflecting on the side surface of a projecting silicon oxide film SOF.

As a result, the accuracy of detecting the center position (coordinates) of the mark MK is further increased. It is possible to accurately detect the deviation amount of the center position (coordinates) of the mark MK and the center position (coordinates) of the opening pattern KPM3 of the photoresist pattern PR3. As a result, it is possible to further improve the accuracy of the superposition inspection.

The projecting length of the silicon oxide film SOF depends on the time of the over etching. Thus, it is preferred to detect the end point of the whole surface etch back process, and to adjust the time of the over etching. Particularly, the whole surface etch back process is performed while detecting light emission derived from a compound of silicon and nitrogen.

Detection is performed to detect a change in the light emission, as the end point, at the time of removing a part of the silicon nitride film SNF positioned over the upper surface of the silicon oxide film SOF. After detecting the end point, adjustment is performed for the time for performing the etching process for the silicon nitride film SNF. According to the above manufacturing method, the time for this over etching is set as short as possible.

The whole surface etch back process is stopped at the time when the end point is detected. After this, the wet etching process is performed. By so doing, the upper surface of the silicon nitride film SNF may be in a position lower than the upper surface of the silicon oxide film SOF. In the case of the dry etching process, etching is performed for a part (projecting part) of the silicon oxide film SOF, which projects as the upper surface of the silicon nitride film SNF drops. Thus, it is assumed that the projecting part is a little rounded.

In the wet etching process, the silicon oxide film SOF is not likely to be etched, thus suppressing that the projecting part is rounded. Because the projecting part of the silicon oxide film SOF is not rounded, it is possible to improve the detection accuracy of the center position (coordinates) of the mark MK at the time of performing optical superposition inspection.

This is an effective method for forming a mark by forming groove patterns in the silicon nitride film, and embedding the silicon oxide film in the groove patterns. When performing a wet etching process for the silicon oxide film, it is possible to attain a high etching selection ratio (a ratio of an etching rate of the silicon oxide film to the etching rate of the silicon nitride film), by using hydrofluoric acid (HF) as an etching solution. As a result, it is possible to etch the silicon oxide film, nearly without etching the silicon nitride film.

A TEOS (Tetra Ethyl Ortho Silicate) oxide film may be applied as the silicon oxide film to be embedded in the groove patterns. The TEOS oxide film is formed under a condition of a temperature lower than the temperature at which the silicon oxide film is formed using another CVD method. Thus, the etching rate of the TEOS oxide film to hydrofluoric acid further increases, and the etching selection ratio can be further increased.

Further, the density of the silicon nitride film may be increased, by performing an additional thermal process for the silicon nitride film. Because the density of the silicon nitride film is increased, the etching rate to hydrofluoric acid is decreased, and the etching selection ratio can further be increased.

The method for increasing the etching selection ratio is not limited to these. The etching selection ratio is increased, thereby suppressing that the projecting part of the mark is rounded. By adjusting the time for performing the over etching process, it is possible to change the ratio of the optical distances of the silicon oxide film and the silicon nitride film in a vertical direction. At the time of performing superposition inspection, it is possible to form a mark which can optically identified. As a result, it is possible to improve the inspection accuracy of the superposition inspection.

Embodiment 3

Descriptions will now be made to another example of a semiconductor device including a mark, for improved inspection accuracy of superposition inspection.

Figure 36:
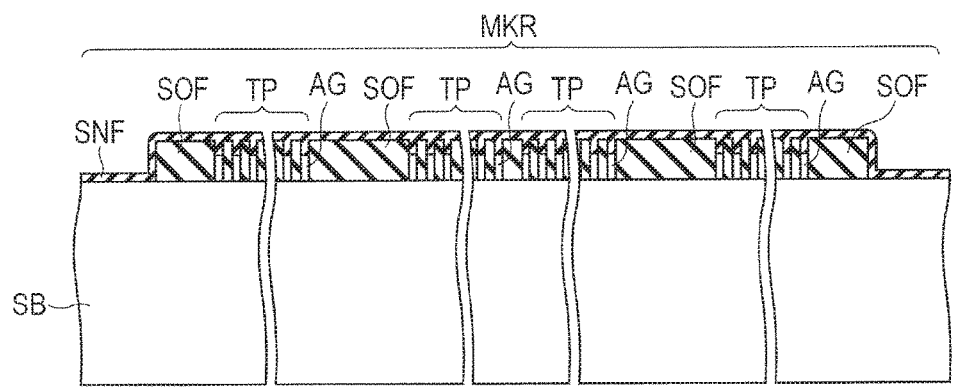
FIG. 36 is a partially enlarged cross section view showing a mark region, and showing one process of a manufacturing method of a semiconductor device according to an embodiment 3.

First, descriptions will now be made to the manufacturing method. The silicon oxide film SOF having a groove pattern TP is patterned (see FIG. 7), through the same process as the process illustrated in each of FIG. 3 to FIG. 7. As illustrated in FIG. 36, the silicon nitride film SNF is formed to cover the silicon oxide film SOF, using, for example, a plasma CVD method.

At this time, the covering property of the silicon nitride film SNF formed using the plasma CVD method is relatively low. Thus, the silicon nitride film SNF is not formed up to the bottom part of the groove pattern TP, while the silicon nitride film SNF is formed in a state where an air gap AG exists between the silicon nitride film SNF and the silicon substrate SB.

Figure 37:
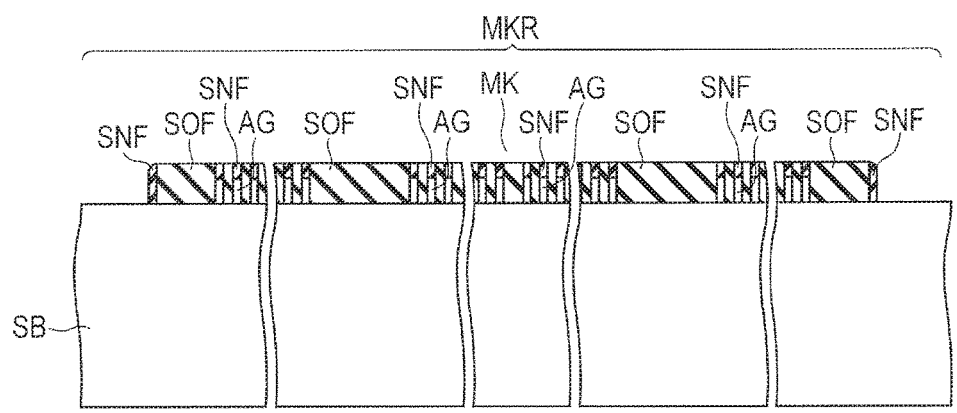
FIG. 37 is a partially enlarged cross sectional view showing a process performed after the process illustrated in FIG. 36, in the same embodiment.
Figure 38:
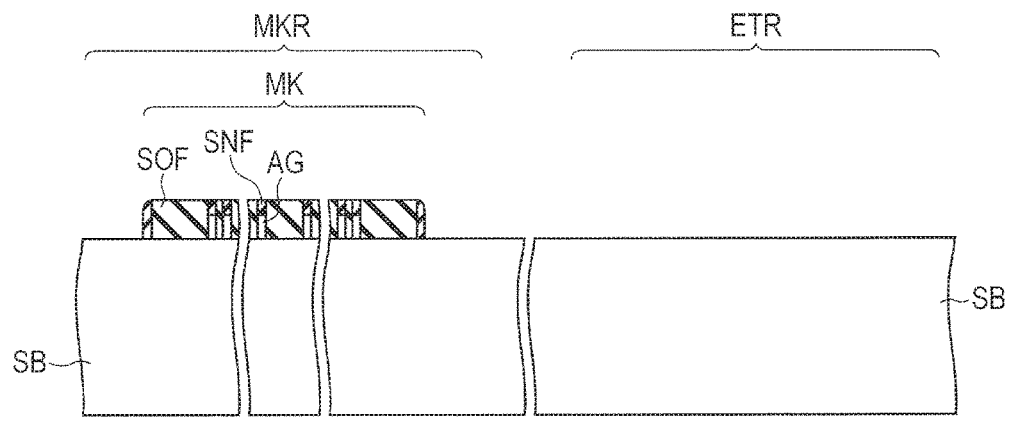
FIG. 38 is a cross sectional view showing a mark region and an element region in the process illustrated in FIG. 37, in the same embodiment.

As illustrated in FIG. 37 and FIG. 38, the whole surface etch back process is performed for the silicon nitride film SNF, thereby removing a part of the silicon nitride film SNF in a position over the upper surface of the silicon oxide film SOF.

Figure 39:
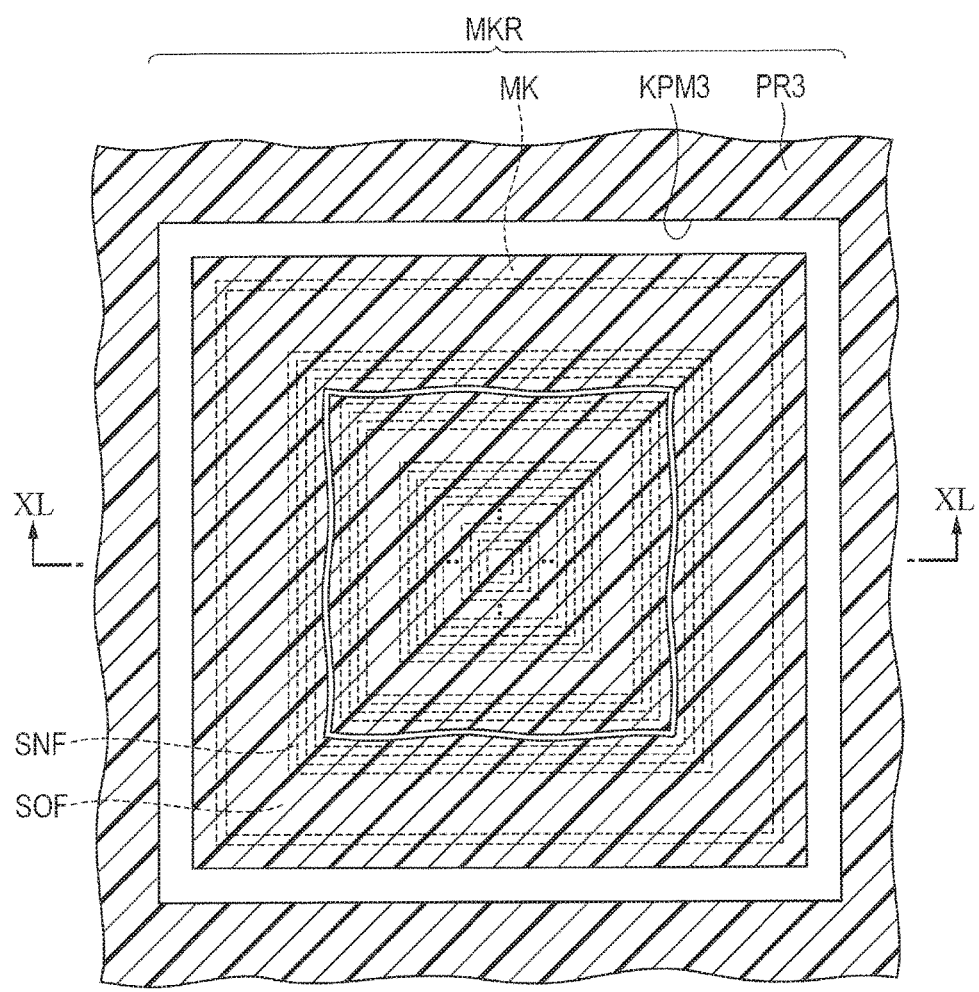
FIG. 39 is a partially enlarged cross sectional view showing the mark region in a process performed after the process illustrated in FIG. 38, in the same embodiment.
Figure 40:
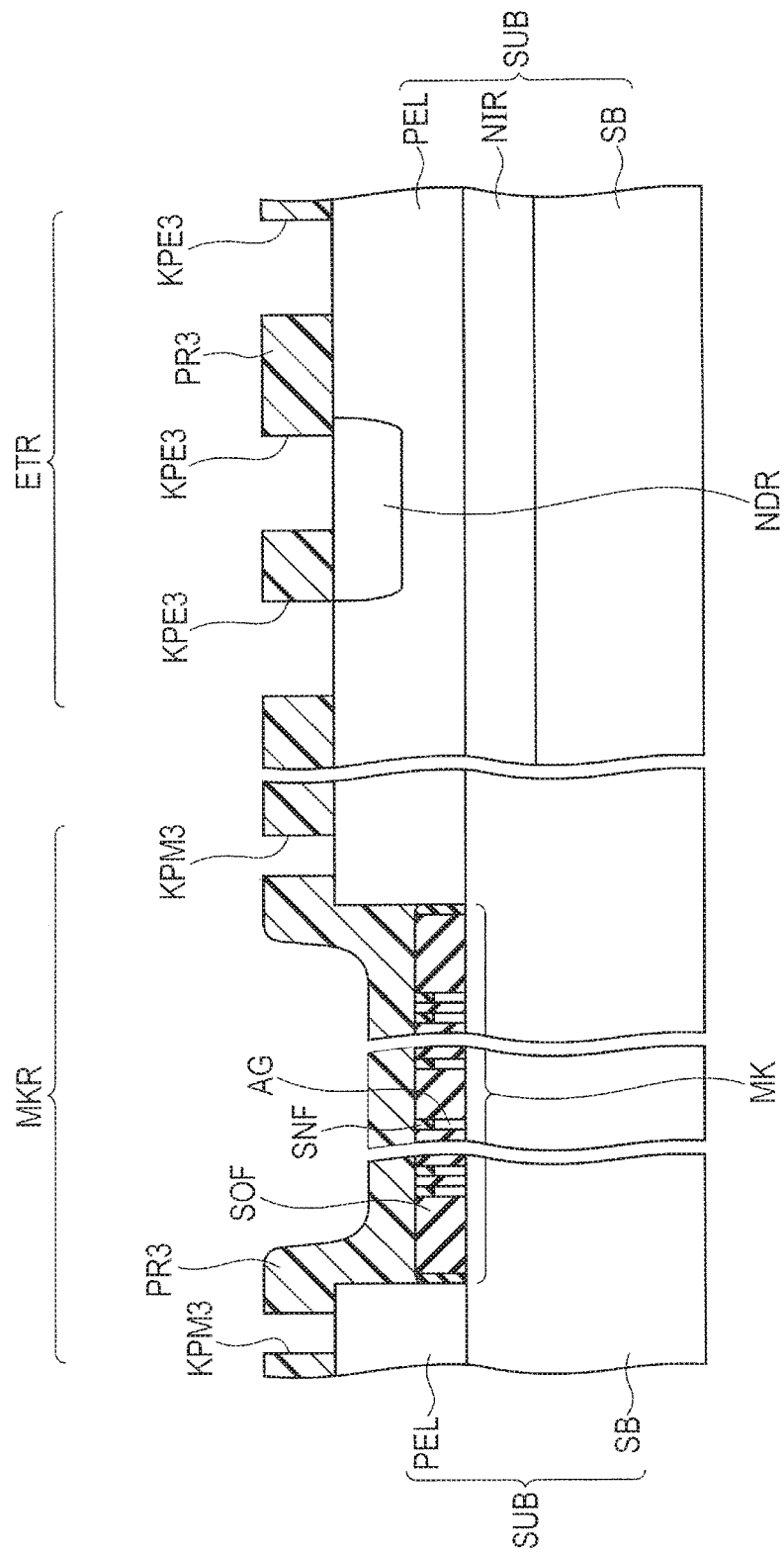
FIG. 40 is a cross sectional view showing the mark region and the element region in the process illustrated in FIG. 39, and including a cross sectional view taken along a line XL-XL illustrated in FIG. 39, in the same embodiment.

As illustrated in FIG. 39 and FIG. 40, the photoresist pattern PR3 for forming the element isolation region is formed through the same process as the process illustrated in each of FIG. 12 to FIG. 18. In the photoresist pattern PR3, the opening pattern KPM3 is formed to surround the mark MK.

Figure 41:
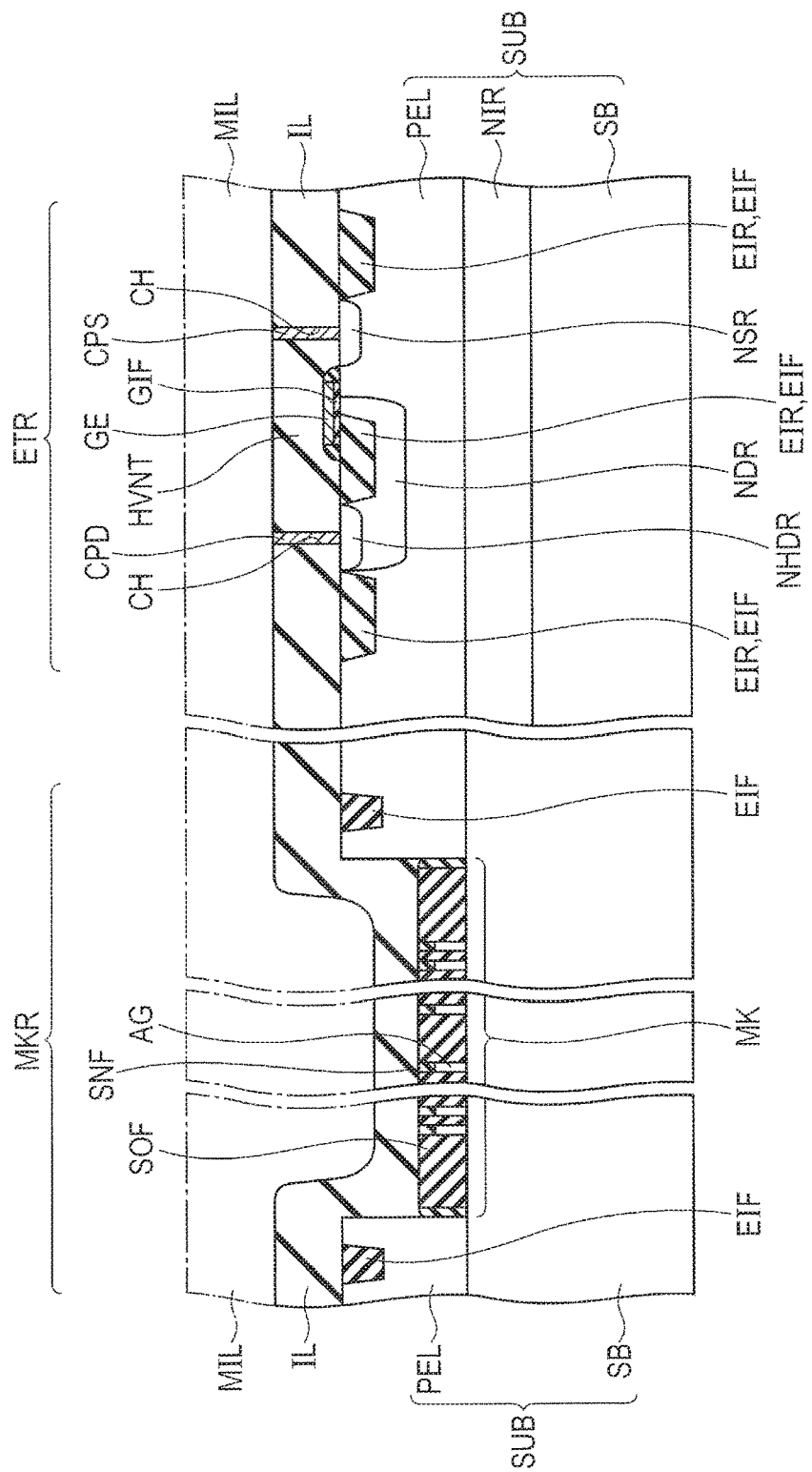
FIG. 41 is a cross sectional view showing a process performed after the process illustrated in FIG. 40, and is a cross sectional view showing a semiconductor device according to the embodiment, in the same embodiment.

Superposition inspection is performed for the photoresist pattern PR3. At this time, as will be described later, the air gap AG exists between the silicon nitride film SNF and the silicon substrate SB, thereby further improving the accuracy of the superposition inspection. After this, as illustrated in FIG. 41, the main parts of the semiconductor device including the high withstand voltage NMOS transistor HVNT are completed, through the same process as the process of each of FIG. 19 to FIG. 21.

In the above-described semiconductor device, the air gap exists between the silicon nitride film SNF and the silicon substrate SB. As a result, the ratio of the optical distances between the silicon oxide film and the silicon nitride film in a vertical direction is changed, thereby enabling to identify optically the mark MK, at the time of superposition inspection.

Because the optically identifiable mark is formed, the detection accuracy of the center position (coordinates) of the mark MK is further improved. Then, it is possible to accurately detect the deviation amount of the center position (coordinates) of the mark MK and the center position (coordinates) of the opening pattern KPM3 of the photoresist pattern PR3. As a result, it is possible to further improve the accuracy of the superposition inspection.

Embodiment 4

Descriptions will now be made to another example of a semiconductor device including a mark, for improved inspection accuracy of superposition inspection.

First, descriptions will be made to the manufacturing method. The photoresist pattern PR1 is formed (see FIG. 5), through the same process as the process illustrated in each of FIG. 3 to FIG. 5. A predetermined etching gas is used, and an etching process is performed for silicon oxide film SOF, using the photoresist pattern PR1 as an etching mask. By so doing, the silicon oxide film SOF positioned over the surface of the silicon substrate SB is removed.

Figure 42:
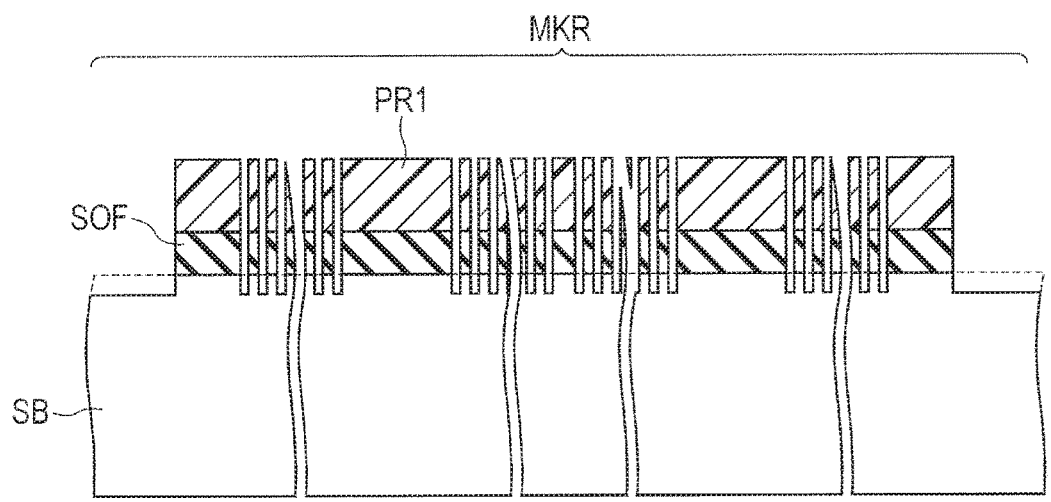
FIG. 42 is a partially enlarged cross sectional view of a mark region, showing one process of a manufacturing method of a semiconductor device according to an embodiment 4.

At the time the surface of the silicon substrate SB is exposed, an etching process is performed for the exposed silicon substrate SB, using another predetermined etching gas. By this etching process, as illustrated in FIG. 42, the position of the surface of the silicon substrate SB is lower than the original position of the surface. After this, the photoresist pattern PR1 is removed. The groove patterns TP (see FIG. 43) penetrate through the silicon oxide film SOF, and are formed up to a predetermined depth in a silicon substrate SB.

Figure 43:
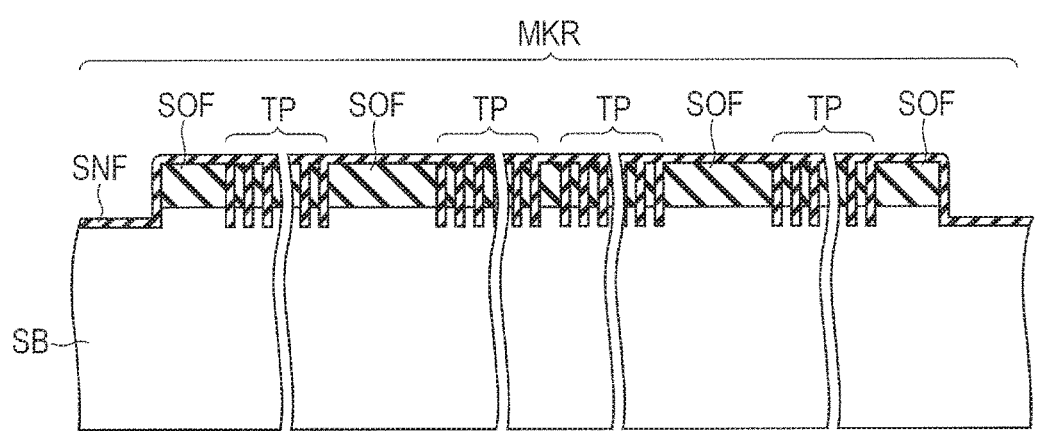
FIG. 43 is a partially enlarged cross sectional view showing a process performed after the process illustrated in FIG. 42, in the same embodiment.
Figure 44:
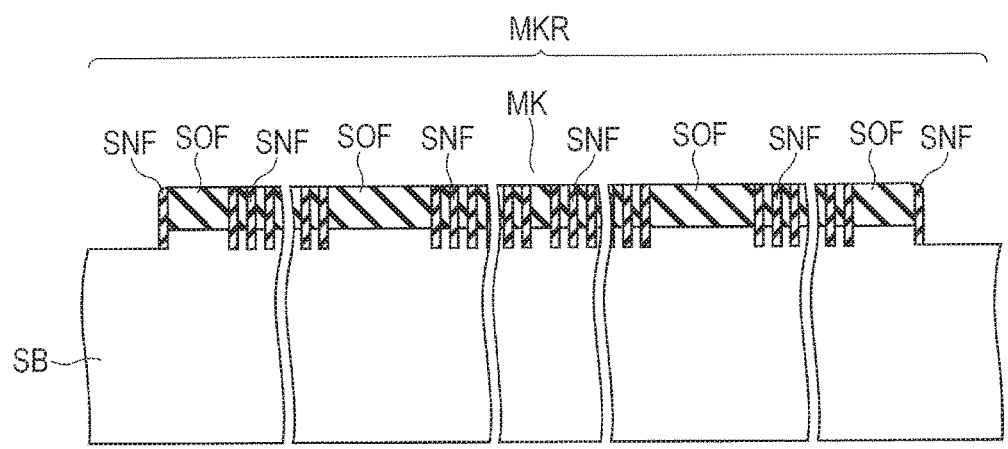
FIG. 44 is a partially enlarged cross sectional view showing a process performed after the process illustrated in FIG. 43, in the same embodiment.
Figure 45:
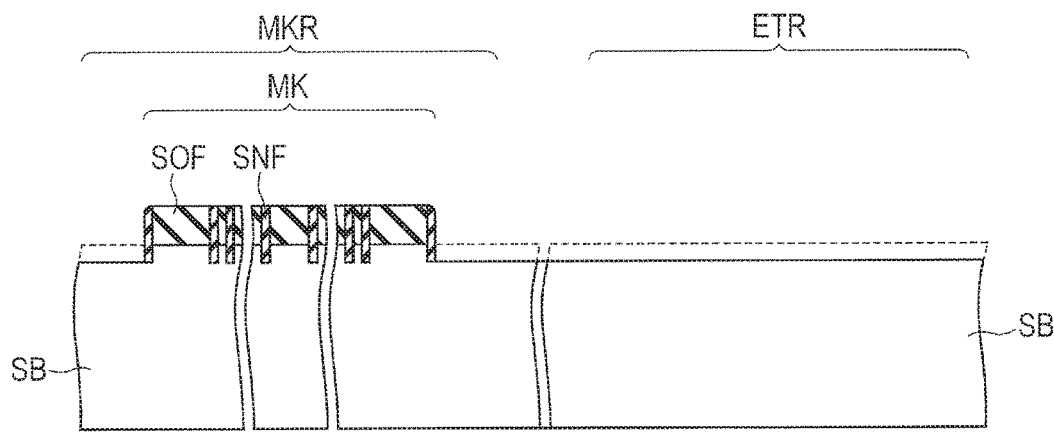
FIG. 45 is a cross sectional view showing a mark region and an element region in the process illustrated in FIG. 44, in the same embodiment.

As illustrated in FIG. 43, in a state where the groove patterns TP are filled, the silicon nitride film SNF is formed to cover the silicon oxide film SOF. The silicon nitride film SNF is formed up to a position deeper than the silicon oxide film SOF. As illustrated in FIG. 44, the whole surface etch back process is performed for the silicon nitride film SNF. In this manner, the mark MK is formed. As illustrated in FIG. 45, at the time the mark MK is formed, the position of the surface of the silicon substrate SB positioned in the element region ETR is also lower than the position of the original surface.

Figure 46:
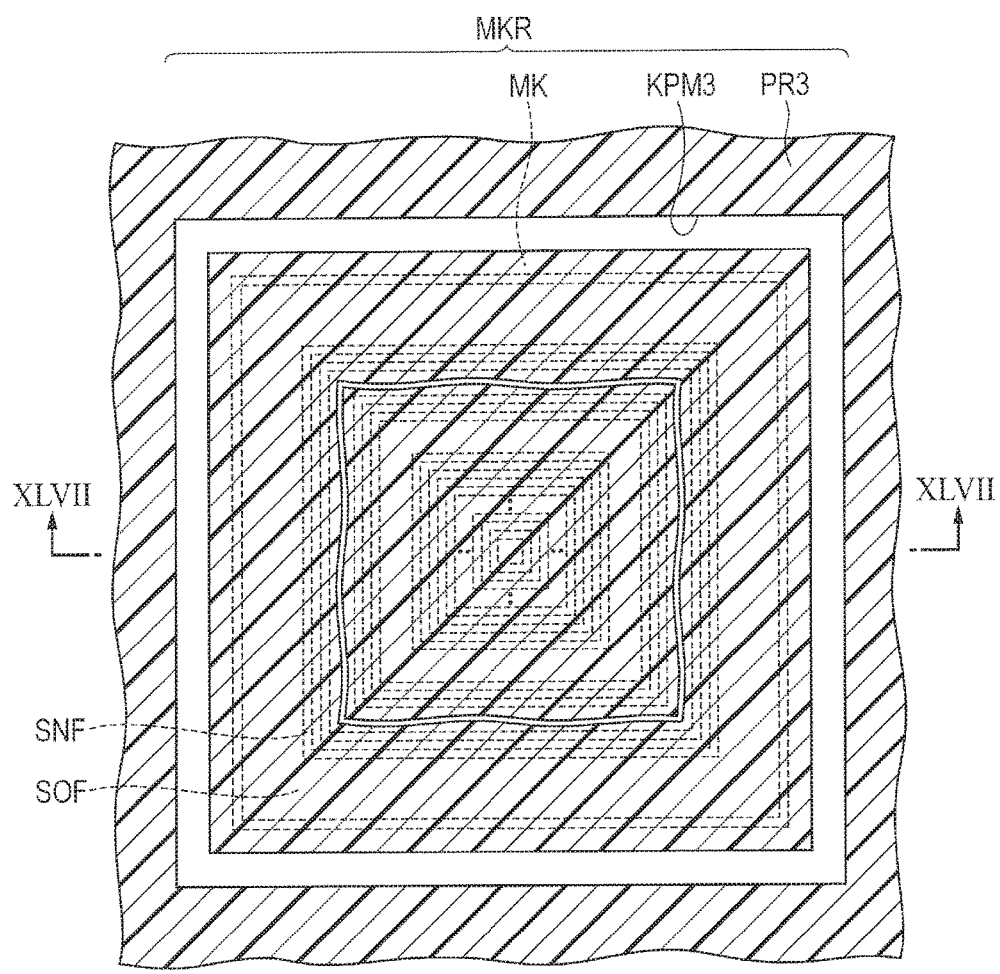
FIG. 46 is a partially enlarged cross sectional view showing a mark region in the process performed after the process illustrated in FIG. 45, in the same embodiment.
Figure 47:
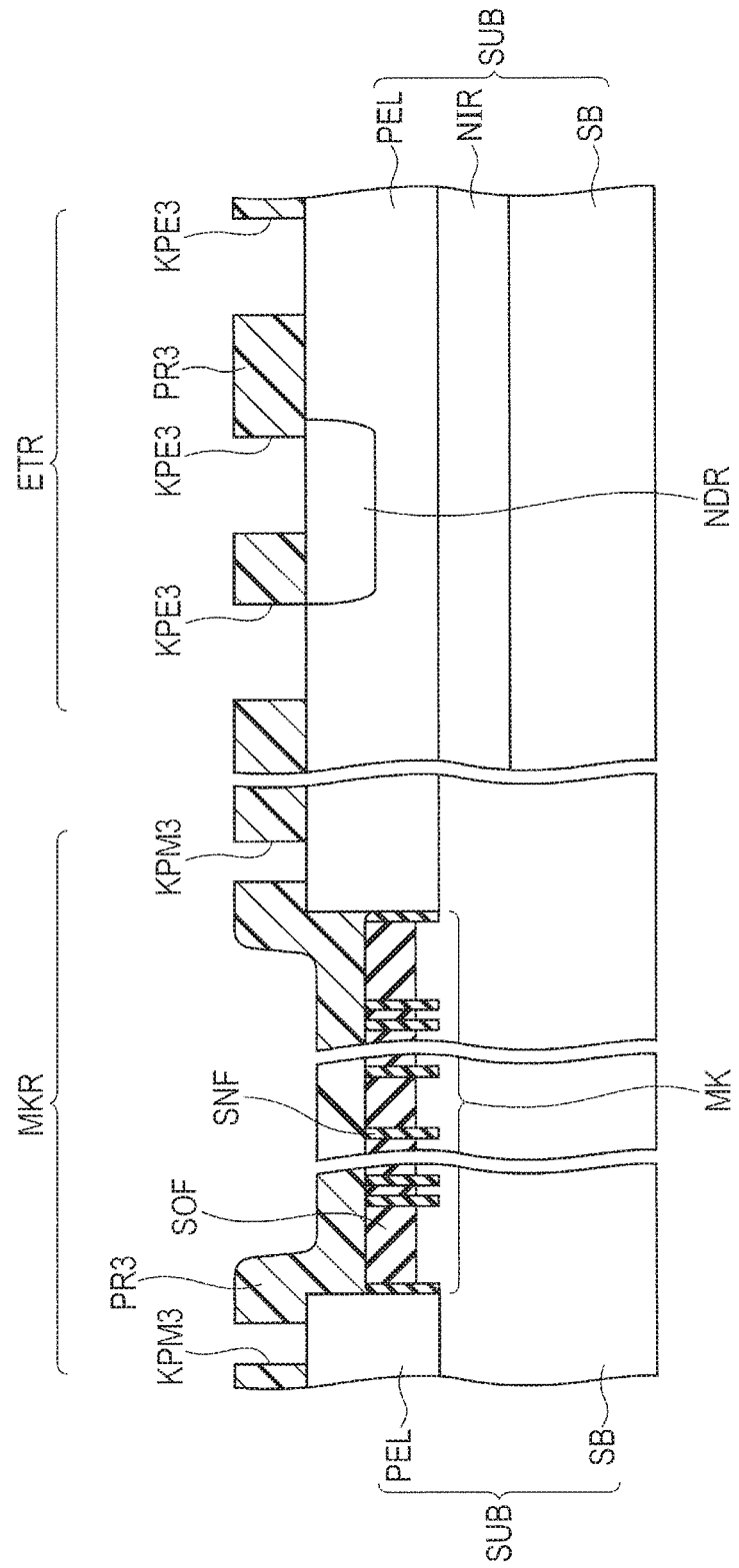
FIG. 47 is a cross sectional view showing a mark region and an element region in the process illustrated in FIG. 46, including a cross sectional view taken along a line XLVII-XLVII illustrated in FIG. 46, in the same embodiment.

As illustrated in FIG. 46 and FIG. 47, the photoresist pattern PR3 for forming the element isolation region is formed, through the same process as the process illustrated in each of FIG. 12 to FIG. 18. The opening pattern KPM3 is formed to surround the mark MK in the photoresist pattern PR3.

Figure 48:
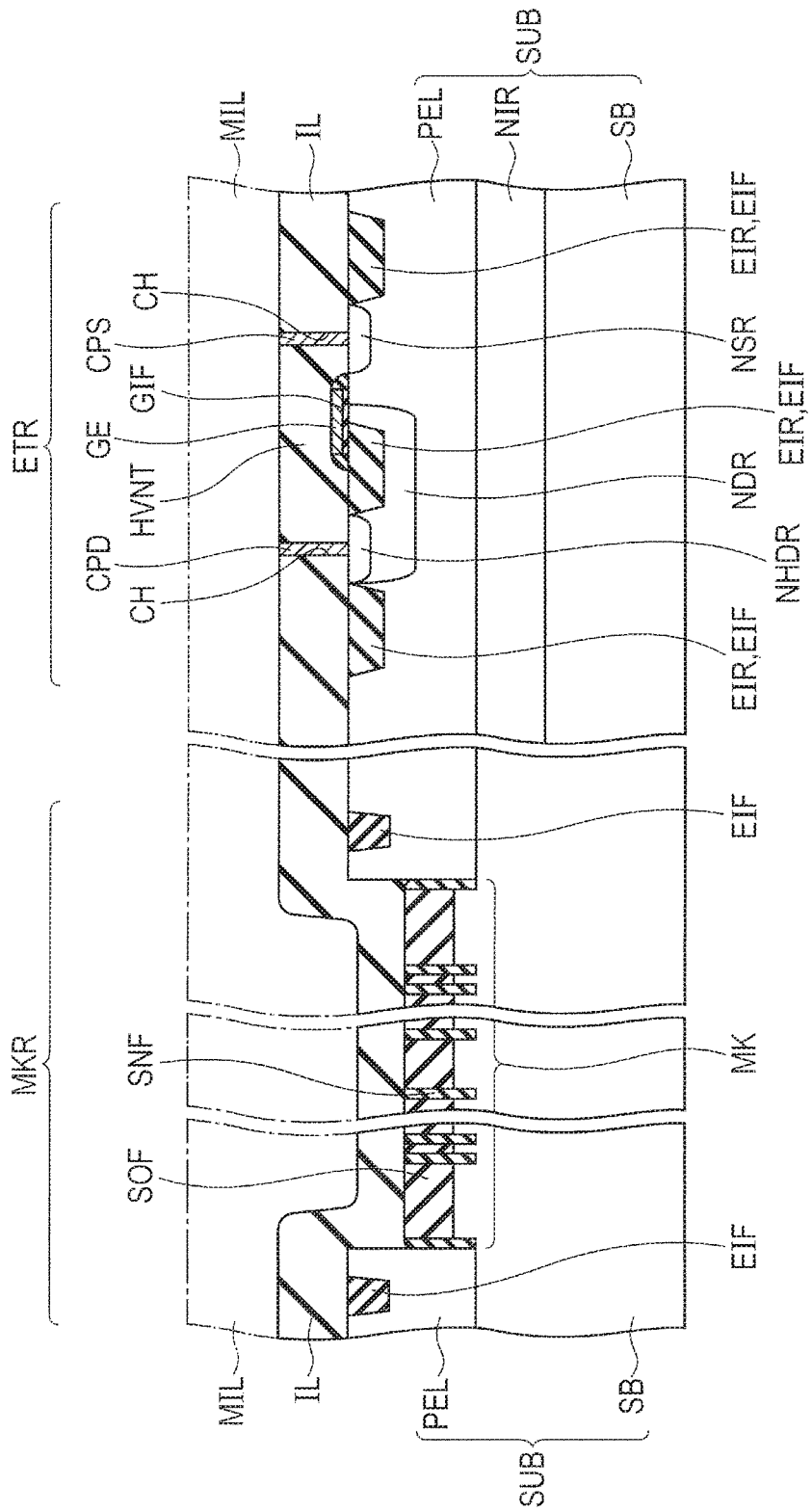
FIG. 48 is a cross sectional view showing a process performed after the process illustrated in FIG. 47, and is a cross sectional view showing a semiconductor device according to the embodiment, in the same embodiment.

Superposition inspection is performed for the photoresist pattern PR3. At this time, as will be described later, the silicon nitride film SNF is formed in a position deeper than the silicon oxide film SOF, thereby improving the accuracy of the superposition inspection. After this, as illustrated in FIG. 48, the main parts of the semiconductor device including the high withstand voltage NMOS transistor HUNT are completed, through the same process as the process illustrated in each of FIG. 19 to FIG. 21.

In the above-described semiconductor device, the silicon nitride film SNF is formed up to a position deeper than the silicon oxide film SOF. Thus, the ratio of the optical distances of the silicon oxide film and the silicon nitride film in a vertical direction is changed. At the time of performing the superposition inspection, the mark MK can optically and more easily be identified.

Because the optically identifiable mark is formed, the detection accuracy of the center position (coordinates) of the mark MK is further improved. It is possible to accurately detect the deviation amount of the center position (coordinates) of the mark MK and the center position (coordinates) of the opening pattern KPM3 of the photoresist pattern PR3. As a result, it is possible to improve the accuracy of the superposition inspection.

In the above-described method, the position of the surface of the silicon substrate SB is lower than the original position of the surface. Thus, even if the thickness of the silicon oxide film SOF is made thin, the thickness of the silicon nitride film SNF in the vertical direction can be secured. Therefore, it is possible to enhance the degree of freedom of the thickness of the silicon oxide film SOF where the groove pattern is formed.

This implies that a mark can possibly be formed together with a process for forming an insulating film for another usage in the semiconductor device, as an insulating film, such as a silicon oxide film SOF where the groove pattern is formed.

In the above-described embodiments, the descriptions have been made to the high withstand voltage NMOS transistor HVNT as a high withstand voltage semiconductor element, by way of example. However, the present invention is not limited to these. Various combinations of the marks of the semiconductor device described in the embodiments are possible, as needed.

Accordingly, the descriptions have specifically been made to the inventions made by the present inventors, based on the preferred embodiments. However, the present invention is not limited to the above-described embodiments. Various changes may possibly be made without departing from the scope thereof.

What is claimed is:

1. A method of manufacturing a semiconductor device, comprising the steps of:
   preparing a crystal substrate;
   forming a mark in a first region of the crystal substrate;
   forming a crystal layer in a second region of the crystal substrate, using an epitaxial growth method;
   forming one photoresist pattern, by applying one photoresist to cover the crystal layer and the mark and performing a photoengraving process; and
   processing the crystal layer, using the one photoresist pattern as a mask,
   wherein the step of forming the mark includes the steps of:
      forming a first insulating film over a surface of the crystal substrate,
      forming another photoresist pattern, by applying another photoresist to cover the first insulating film and performing a photoengraving process,
      forming a first pattern having a groove pattern, by etching the first insulating film, using the another photoresist pattern as an etching mask,
      forming a second insulating film having a material different from that of the first insulating film, to cover the first pattern, and
      forming a second pattern, by performing anisotropic etching for an entire surface of the second insulating film to remove the second insulating film while a part of the second insulating film remains which is positioned in the groove pattern.

2. The method of manufacturing a semiconductor device, according to claim 1,
   wherein, in the step of forming the second pattern, an upper surface of the second insulating film which remains as the second pattern is formed in a position lower than an upper surface of the first insulating film as the first pattern.

3. The method of manufacturing a semiconductor device, according to claim 1,
   wherein, in the step of forming the second insulating film, a lower surface of the part of the second insulating film which remains in the groove pattern is formed in a position higher than a lower surface of the first insulating film.

4. The method of manufacturing a semiconductor device, according to claim 1,
   wherein, in the step of forming the first pattern, a surface of the crystal substrate which is positioned in a region other than the first region is in a position lower than a surface of a part of the crystal substrate which is positioned in the first region.

5. The method of manufacturing a semiconductor device, according to claim 1, further comprising the steps of:
   defining the second region on the crystal layer, and
   forming a high withstand voltage transistor in the second region.

6. The method of manufacturing a semiconductor device, according to claim 1,
   wherein, in the step of forming the first insulating film, one of a silicon oxide film and a silicon nitride film is formed as the first insulating film, and
   wherein, in the step of forming the second insulating film, the other one of the silicon oxide film and the silicon nitride film is formed as the second insulating film.

7. The method of manufacturing a semiconductor device, according to claim 1,
   wherein, in the step of forming the one photoresist pattern, a pattern corresponding to a trench is formed,
   wherein, in the step of processing the crystal layer, a trench is formed in the crystal layer, and
   wherein the method further includes a step of forming an element isolation region, by forming an element isolation film in the trench.

* * * * *